(12) United States Patent
Tsukada et al.

(10) Patent No.: US 8,510,629 B2
(45) Date of Patent: Aug. 13, 2013

(54) MEMORY MODULE ON WHICH REGULAR CHIPS AND ERROR CORRECTION CHIPS ARE MOUNTED

(75) Inventors: Wataru Tsukada, Tokyo (JP); Shiro Harashima, Tokyo (JP); Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 353 days.

(21) Appl. No.: 12/908,512

(22) Filed: Oct. 20, 2010

(65) Prior Publication Data
US 2011/0093764 A1   Apr. 21, 2011

(30) Foreign Application Priority Data

Oct. 21, 2009   (JP) ................................ 2009-242279

(51) Int. Cl.
*G11C 29/00*   (2006.01)
(52) U.S. Cl.
USPC ........................................................ 714/763
(58) Field of Classification Search
USPC ........................................................ 714/763
See application file for complete search history.

(56) References Cited

U.S. PATENT DOCUMENTS

| | | | |
|---|---|---|---|
| 7,440,289 B2 | 10/2008 | Sugano et al. | |
| 7,487,428 B2* | 2/2009 | Co et al. | 714/763 |
| 7,519,894 B2* | 4/2009 | Weiβ et al. | 714/763 |
| 7,590,899 B2* | 9/2009 | Swietek et al. | 714/718 |
| 8,082,474 B2* | 12/2011 | Ferraiolo et al. | 714/704 |
| 8,140,936 B2* | 3/2012 | Gower et al. | 714/758 |
| 8,199,521 B2* | 6/2012 | Muff | 361/777 |
| 2006/0171247 A1* | 8/2006 | Hoppe et al. | 365/233 |
| 2006/0179183 A1* | 8/2006 | Brittain et al. | 710/35 |
| 2007/0011574 A1* | 1/2007 | Weiss et al. | 714/763 |
| 2007/0033490 A1* | 2/2007 | Moosrainer et al. | 714/763 |
| 2008/0094811 A1* | 4/2008 | Hazelzet | 361/760 |
| 2009/0085604 A1* | 4/2009 | David | 326/30 |
| 2009/0177946 A1* | 7/2009 | Dasari et al. | 714/763 |

FOREIGN PATENT DOCUMENTS

JP   2008-135597 A   6/2008

* cited by examiner

*Primary Examiner* — Michael Maskulinski
*Assistant Examiner* — Neil Miles
(74) *Attorney, Agent, or Firm* — Sughrue Mion, PLLC

(57) ABSTRACT

Regular chip packages that store user data therein and error-correction chip packages that store an error correction code therein are mounted on a module substrate. The module substrate has first and second mounting areas of different coordinates in an X direction, and the second mounting area has third and fourth mounting areas of different Y coordinates. The regular packages are oppositely arranged in the first mounting area on a surface and the back surface of the module substrate. The error-correction chip packages are oppositely arranged in the third mounting area on the surface and the back surface of the module substrate. A memory buffer that buffers user data and an error correction code is arranged in the fourth mounting area.

7 Claims, 27 Drawing Sheets

|  | MEMORY BUFFER | 2ia,30a | | 2ib,30b | | 2ic,30c | | 2id,30d | |
|---|---|---|---|---|---|---|---|---|---|
|  |  | R0 | R2 | R1 | R3 | R4 | R6 | R5 | R7 |
| READ OPERATION OF R0 | 60Ω | off | off | off | off | 20Ω | off | off | off |
| READ OPERATION OF R2 | 60Ω | off | off | off | off | 20Ω | off | off | off |
| WRITE OPERATION OF R0 | — | 120Ω | off | off | off | 20Ω | off | off | off |
| WRITE OPERATION OF R2 | — | off | 120Ω | off | off | 20Ω | off | off | off |

FIG.8

| LENGTH OF WIRING PORTION | | | | |
| --- | --- | --- | --- | --- |
|  | TL0 | TL1 | TL2 | TL3 |
| DATA WIRING 50 (FARTHEST) | 0.58mm | 71.79mm | 10.00mm | 2.32mm |
| DATA WIRING 60 (NEAREST) | 0.97mm | 19.80mm | 10.00mm | 2.32mm |

| OTHER PARAMETER | |
| --- | --- |
| POWER SOURCE VOLTAGE | 1.5V |
| ON RESISTANCE OF MEMORY BUFFER | 20Ω |
| ON RESISTANCE OF MEMORY CHIP | 34Ω |

FIG.11

|  | MEMORY BUFFER | 2ia,30a | | 2ib,30b | | 2ic,30c | | 2id,30d | |
|---|---|---|---|---|---|---|---|---|---|
|  |  | R0 | R2 | R1 | R3 | R4 | R6 | R5 | R7 |
| READ OPERATION OF R0 | 80 Ω | off | off | 40 Ω | off | 40 Ω | off | 40 Ω | off |
| READ OPERATION OF R2 | 80 Ω | off | off | 40 Ω | off | 40 Ω | off | 40 Ω | off |
| WRITE OPERATION OF R0 | — | 120 Ω | off | 40 Ω | off | 40 Ω | off | 40 Ω | off |
| WRITE OPERATION OF R2 | — | off | 120 Ω | 40 Ω | off | 40 Ω | off | 40 Ω | off |

FIG.16

MEMORY MODULE ON WHICH REGULAR CHIPS AND ERROR CORRECTION CHIPS ARE MOUNTED

BACKGROUND OF THE INVENTION

1. Field of the Invention

The present invention relates to a memory module, and particularly relates to a load-reduced memory module having an error correction chip mounted thereon.

2. Description of Related Art

A memory module such as a DIMM (Dual Inline Memory Module) is configured to have many memory chips such as a DRAM (Dynamic Random Access Memory) mounted on a module substrate. Such a memory module is mounted on a memory slot provided on a mother board, thereby transferring data between a memory controller and the memory slot. Because the memory capacity required by a system is very large in recent years, securing a necessary memory capacity by one memory module has been difficult. Therefore, plural memory slots are normally provided on the mother board, thereby making it possible to mount plural memory modules in many cases.

However, when plural memory modules are mounted, the load capacitance of a data wiring on the mother board becomes large, and the signal quality is degraded. This is not a serious problem when a data transfer rate between a memory controller and a memory module is relatively low. However, when a data transfer rate between a memory controller and a memory module becomes higher, data cannot be transferred correctly due to degradation of the signal quality. In recent years, a data transfer rate of about 1.6 to 3.2 Gbps is required. Therefore, to achieve such a high-speed transfer, the load capacitance of a data wiring on the mother board needs to be sufficiently reduced.

A so-called a fully-buffered memory module has been known as a memory module in which the load capacitance of a data wiring can be reduced (Japanese Patent Application Laid-open No. 2008-135597). In the fully-buffered memory module, write data supplied from a memory controller is once all received by an exclusive chip called an advanced memory buffer (AMB), and the data is supplied to a predetermined memory chip. A read operation is performed in an opposite manner, that is, read data output from a memory chip is once all supplied to an AMB, and the data is supplied to a memory controller from the AMB. Because the load capacitance of each memory chip is not visible from the memory controller, the load capacitance of a data wiring is reduced substantially.

However, the AMB used for the fully-buffered memory module is a highly functional chip and is relatively expensive. Therefore, the price of the memory module becomes substantially high. Further, according to the fully-buffered memory module, an interface between a memory controller and the AMB is different from a normal interface between a memory controller and a memory chip, and therefore a conventional memory controller cannot be directly used.

Due to the above background, a memory module referred to as "load-reduced memory module" has been proposed in recent years. The load-reduced memory module uses a relatively simple memory buffer having a register function instead of an AMB. Because a memory buffer is a chip only buffers data and a signal such as a command and an address, the memory buffer can be provided at low cost. Further, because the interface between a memory controller and a memory buffer is not different from a normal interface between a memory controller and a memory chip, the conventional memory controller can be directly used.

Meanwhile, a memory module often has mounted thereon an error correction chip that stores an error correction code not only a regular memory chip (a regular chip) to store user data. The error correction chip is accessed simultaneously with the regular chip, thereby reading an error correction code simultaneously with reading of user data, or writing an error correction code simultaneously with writing of user data.

Normally, error correction chips are collectively arranged on a back surface of a memory buffer. However, when error correction chips are collectively arranged on the back surface of the memory buffer, a topology of a wiring connecting a memory buffer and an error correction chip becomes different from that of a wiring connecting a memory buffer and a regular chip. Therefore, it becomes difficult to satisfy the signal quality of user data and that of an error correction code at the same time, and a high data transfer rate cannot be achieved.

In one embodiment, there is provided a memory module that includes: a module substrate having a plurality of external terminals arranged in a first direction; a plurality of memory chips mounted on the module substrate; and a memory buffer that is mounted on the module substrate and buffers a data signal transmitted and received between at least the memory chips and the external terminals, wherein the memory chips include: a plurality of regular chips including at least first to fourth regular chips that store therein user data contained in the data signal; and a plurality of error-correction chips including first to fourth error-correction chips that store therein an error correction code contained in the data signal to correct an error of the user data, the module substrate has first and second mounting areas of different coordinates in the first direction, the second mounting area has third and fourth mounting areas of different coordinates in a second direction different from the first direction, the first and second regular chips are oppositely arranged on a surface and a back surface of the module substrate in the first mounting area, the third and fourth regular chips are oppositely arranged on the surface and the back surface of the module substrate in the first mounting area, the first and second error-correction chips are oppositely arranged on the surface and the back surface of the module substrate in the third mounting area, the third and fourth error-correction chips are oppositely arranged on the surface and the back surface of the module substrate in the third mounting area, the first error-correction chip and the third error-correction chip are adjacently arranged in the first direction, the second error-correction chip and the fourth error-correction chip are adjacently arranged in the first direction, and the memory buffer is arranged in the fourth mounting area.

According to the present invention, a topology of a wiring connecting a memory buffer and an error correction chip can be matched with that of a wiring connecting a memory buffer and a regular chip. Therefore, it becomes possible to satisfy the signal quality of user data and that of an error correction code at the same time. As a result, a high data transfer rate can be achieved.

BRIEF DESCRIPTION OF THE DRAWINGS

The above features and advantages of the present invention will be more apparent from the following description of certain preferred embodiments taken in conjunction with the accompanying drawings, in which:

FIG. 1A is a plan view as viewed from a main surface 11a, and FIG. 1B is a plan view as viewed from the other main surface 11b;

FIG. 8 is a table showing an example of an ODT control of the eight memory chips R0 to R7;

FIG. 9A shows signal waveforms of data signals transferred to memory chips nearest to the memory buffer 40, and FIG. 9B shows signal waveforms of data signals transferred to memory chips farthest from the memory buffer 40;

FIG. 10A shows signal waveforms of data signals read from memory chips nearest to the memory buffer 40, and FIG. 10B shows signal waveforms of data signals read from memory chips farthest from the memory buffer 40

FIG. 11 is a table showing simulation conditions;

FIG. 12A is a plan view as viewed from the main surface 11a, and FIG. 12B is a plan view as viewed from the other main surface 11;

FIG. 13A shows a first example, and FIG. 13B shows a second example;

FIG. 16 is a table showing an example of an ODT control of the eight memory chips R0 to R7;

FIG. 18A shows signal waveforms when four terminating control signals ODT0 to ODT3 are used, and FIG. 18B shows signal waveforms when two terminating control signals ODT0 and ODT1 are used;

FIG. 19A shows signal waveforms when the four terminating control signals ODT0 to ODT3 are used, and FIG. 19B shows signal waveforms when the two terminating control signals ODT0 and ODT1 are used;

FIG. 21A shows waveforms during a read operation, and FIG. 21B shows waveforms during a write operation;

FIG. 22A shows a plan view as viewed from the main surface 11a, and FIG. 22B is a plan view as viewed from the other main surface 11b;

FIG. 23A shows a structure of a data wiring 110, and FIG. 23B shows mounting positions of packages 120 to 123;

FIG. 24A shows a structure of a data wiring 130, and FIG. 24B shows mounting positions of packages 140 to 143;

FIG. 25A shows a structure of a data wiring 150, and FIG. 25B shows mounting positions of packages 160 to 163;

FIG. 26A shows a structure of a data wiring 170, and FIG. 26B shows mounting positions of packages 180 to 183.

DETAILED DESCRIPTION OF THE EMBODIMENTS

Preferred embodiments of the present invention will be explained below in detail with reference to the accompanying drawings.

Figure 1A:
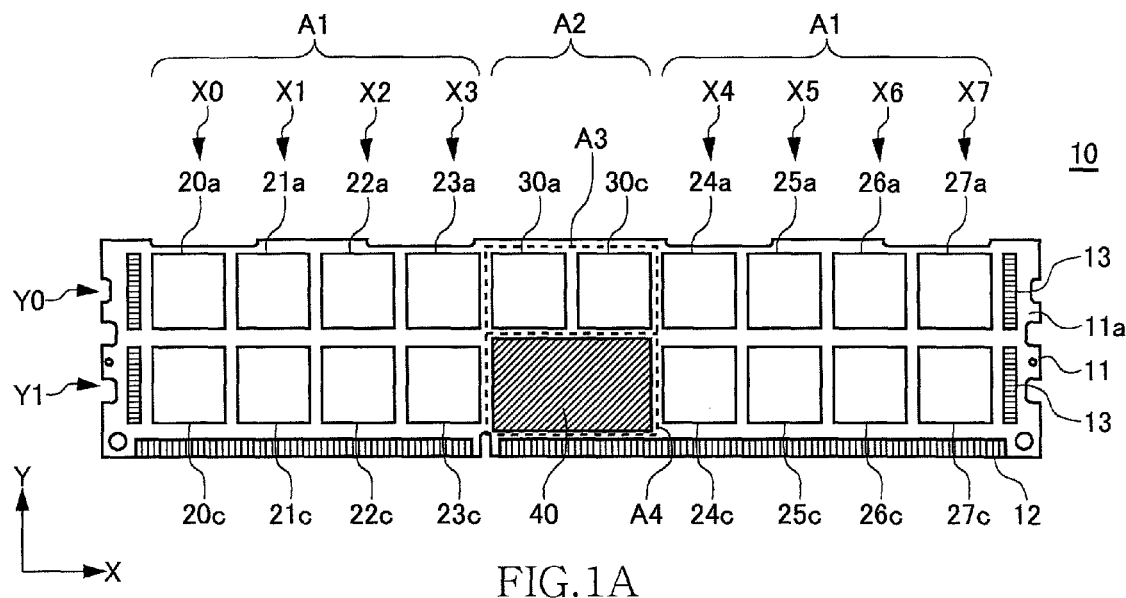
FIGS. 1A and 1B show a structure of a memory module 10 according to an embodiment of the present invention.
Figure 1B:
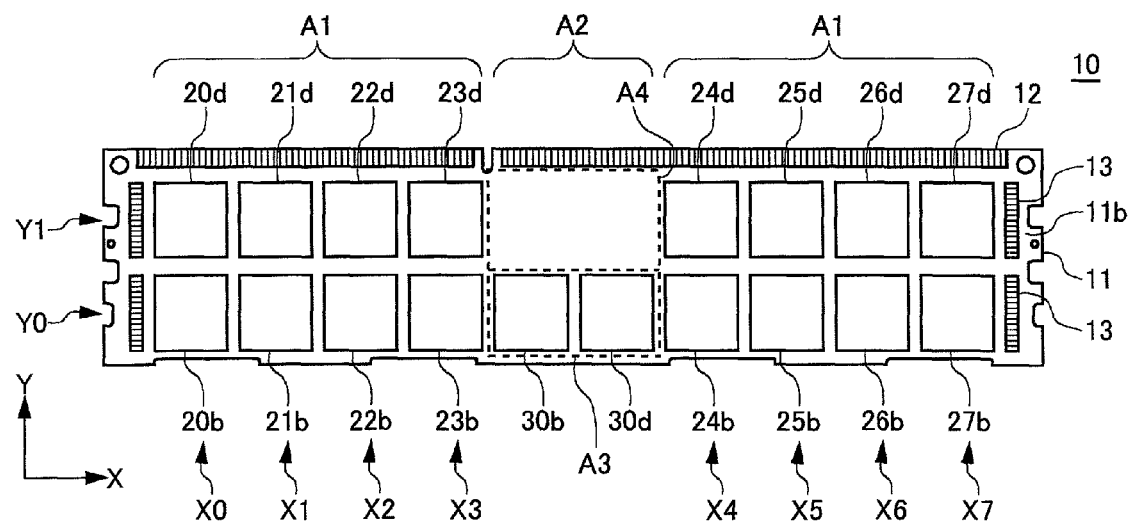

FIGS. 1A and 1B show a structure of a memory module 10 according to an embodiment of the present invention. FIG. 1A is a plan view as viewed from a main surface 11a, and FIG. 1B is a plan view as viewed from the other main surface 11b.

As shown in FIGS. 1A and 1B, the memory module 10 according to the present embodiment is configured by a module substrate 11, plural memory chip packages 2ia to 2id (i=0 to 7) and 30a to 30d mounted on the module substrate 11, and a memory buffer 40. In the present embodiment, a planar shape of the memory chip packages 2ia to 2id and 30a to 30d is approximately square.

The module substrate 11 is a printed substrate having a multilayer wiring provided thereon, and its planar shape is approximately rectangle with an X direction shown in FIGS. 1A and 1B as a long side and a Y direction as a short side. Plural external terminals 12 are provided on one side of the module substrate 11 along the X direction as a long side. The external terminals 12 are used to provide an electric connection with a memory controller via memory slots. The external terminals 12 include a data terminal, an address terminal, a command terminal, a clock terminal, a power source terminal, and a reference potential terminal. The module substrate 11 has the main surface 11a and the other main surface 11b. Memory chip packages and memory buffers are mounted on the main surfaces 11a and 11b. The main surfaces 11a and 11b of the module substrate have mounting areas Y0 and Y1 of which Y coordinates are different from each other, and the memory chip packages and the memory buffers are mounted on either one of the mounting areas Y0 and Y1. That is, in the present embodiment, the memory chip packages and the memory buffers are arranged in two arrays.

The memory chip packages include the above 2ia to 2id as plural regular chip packages that store user data therein, and the above 30a to 30d as plural error-correction chip packages that store error correction code therein. Therefore, in the present embodiment, 32 regular chip packages and four error-correction chip packages are mounted. The error correction codes are used to correct errors of user data. In the present embodiment, a one-bit error correction code is allocated to eight-bit user data.

Figure 2:
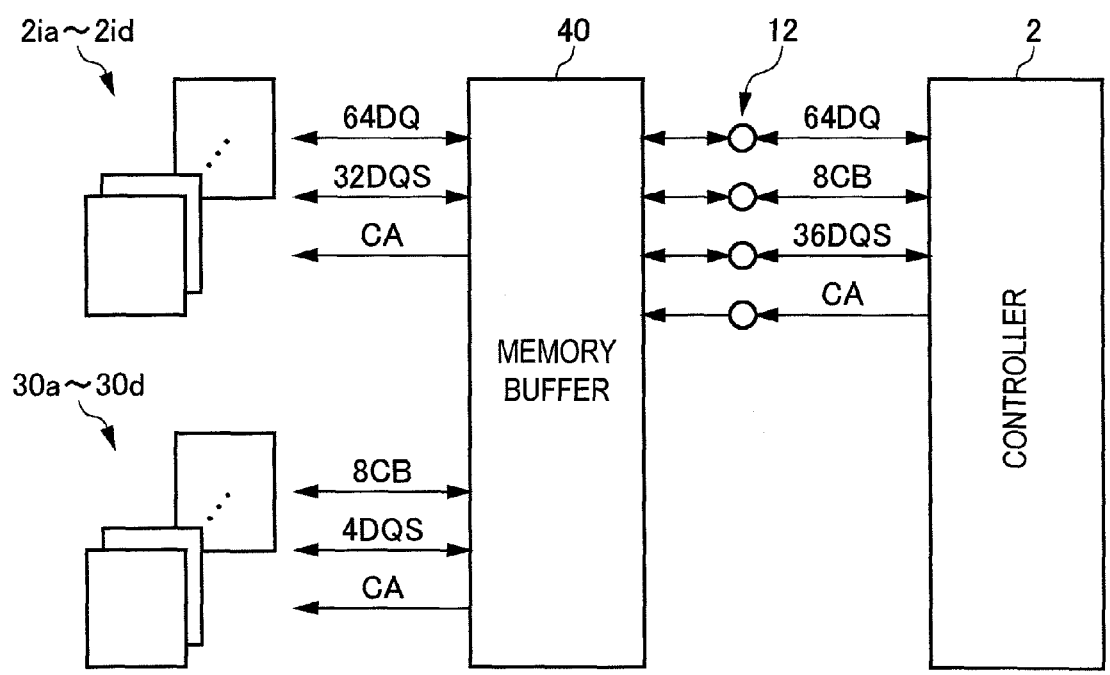
FIG. 2 is a schematic diagram for explaining a connection relationship between memory chip packages and a controller.

FIG. 2 is a schematic diagram for explaining a connection relationship between memory chip packages and a controller.

As shown in FIG. 2, 64-bit user data DQ, an 8-bit error correction code (a check bit) CB, and a 36-bit strobe signal DQS are transmitted and received between a controller 2 and the memory buffer 40 via the external terminals 12. The controller 2 supplies a command address signal CA including an address signal, a command signal, and a clock signal to the memory buffer 40 via the external terminals 12. 64-bit user data DQ and a 32-bit strobe signal DQS are transmitted and received between the memory buffer 40 and the regular chip packages 2ia to 2id. The memory buffer 40 supplies the command address signal CA to the regular chip packages 2ia to 2id. The 8-bit error correction code (the check bit) CB and a 4-bit strobe signal DQS are transmitted and received between the memory buffer 40 and the error-correction chip packages 30a to 30d. The memory buffer 40 supplies the command address signal CA to the error-correction chip packages 30a to 30d.

In the present embodiment, two memory chips are packaged in one memory chip package. Therefore, 64 regular chips and eight error correction chips are mounted in the present embodiment. The regular chips and the error correction chips have the same circuit configurations, and a DDR (Double Data Rate)3 SDRAM (Synchronous Dynamic Random Access Memory) can be used, although not particularly limited. The same addresses are allocated to 72 memory chips including the 64 regular chips and the eight error-correction chips.

As shown in FIGS. 1A and 1B, the regular chip packages 2ia to 2id are mounted in a mounting area Xi at mutually different X coordinates. For example, regular chip packages 20a to 20d are mounted in a mounting area X0, and regular chip packages 21a to 21d are mounted in a mounting area X1. In the present specification, mounting areas X0 to X7 are also called a mounting area A1. Eight regular chips mounted in the same mounting area Xi are exclusively selected by a chip selection signal (CS) supplied from a command terminal. That is, eight chip-selection signals constitute an eight-rank product. Accordingly, one regular chip is selected from each of the mounting areas X0 to X7 as regular chips selected simultaneously, and eight regular chips in total are selected simultaneously. Although not particularly limited, one regular chip has eight bits for I/O (the number of bits of data that can be simultaneously input and output). Therefore, 64-bit user data DQ are simultaneously input and output via the external terminals 12.

The regular chip package 2ia attached with "a" at the end of reference numeral and the regular chip package 2ib attached with "b" at the end of reference numeral are oppositely arranged on a surface and a back surface of the module substrate 11. Similarly, the regular chip package 2ic attached with "c" at the end of reference numeral and the regular chip package 2id attached with "d" at the end of reference numeral are oppositely arranged on the surface and the back surface of the module substrate 11. The regular chip package 2ia attached with "a" at the end of reference numeral and the regular chip package 2ic attached with "c" at the end of reference numeral are adjacently arranged in the Y direction on the main surface 11a of the module substrate 11. Similarly, the regular chip package 2ib attached with "b" at the end of reference numeral and the regular chip package 2id attached with "d" at the end of reference numeral are adjacently arranged in the Y direction on the other main surface 11b of the module substrate 11.

As shown in FIGS. 1A and 1B, an area sandwiched between the mounting areas X0 to X3 and the mounting areas X4 to X7 is a mounting area A2. The error-correction chip packages 30a to 30d and the memory buffer 40 are mounted in the area A2. More specifically, the mounting area A2 includes a mounting area A3 positioned in the mounting area Y0, and a mounting area A4 positioned in the mounting area Y1. The error-correction chip packages 30a to 30d are mounted in the mounting area A3, and the memory package 40 is mounted in the mounting area A4. The error-correction chip packages 30a to 30d correspond to the regular chip packages 2ia to 2id, respectively, and memory chips within the corresponding packages are selected simultaneously. More specifically, eight error-correction chips in total are exclusively selected by a chip selection signal, and 8-bit error correction codes corresponding to selected error-correction chips are simultaneously input and output via the external terminals 12.

The error-correction chip package 30a and the error-correction chip package 30b are oppositely arranged on the surface and the back surface of the module substrate 11. Similarly, the error-correction chip package 30c and the error-correction chip package 30d are oppositely arranged on the surface and the back surface of the module substrate 11. The error-correction chip package 30a and the error-correction chip package 30c are adjacently arranged in the X direction on the main surface 11a of the module substrate 11. The error-correction chip package 30b and the error-correction chip package 30d are adjacently arranged in the X direction on the other main surface 11b of the module substrate 11.

Figure 3:
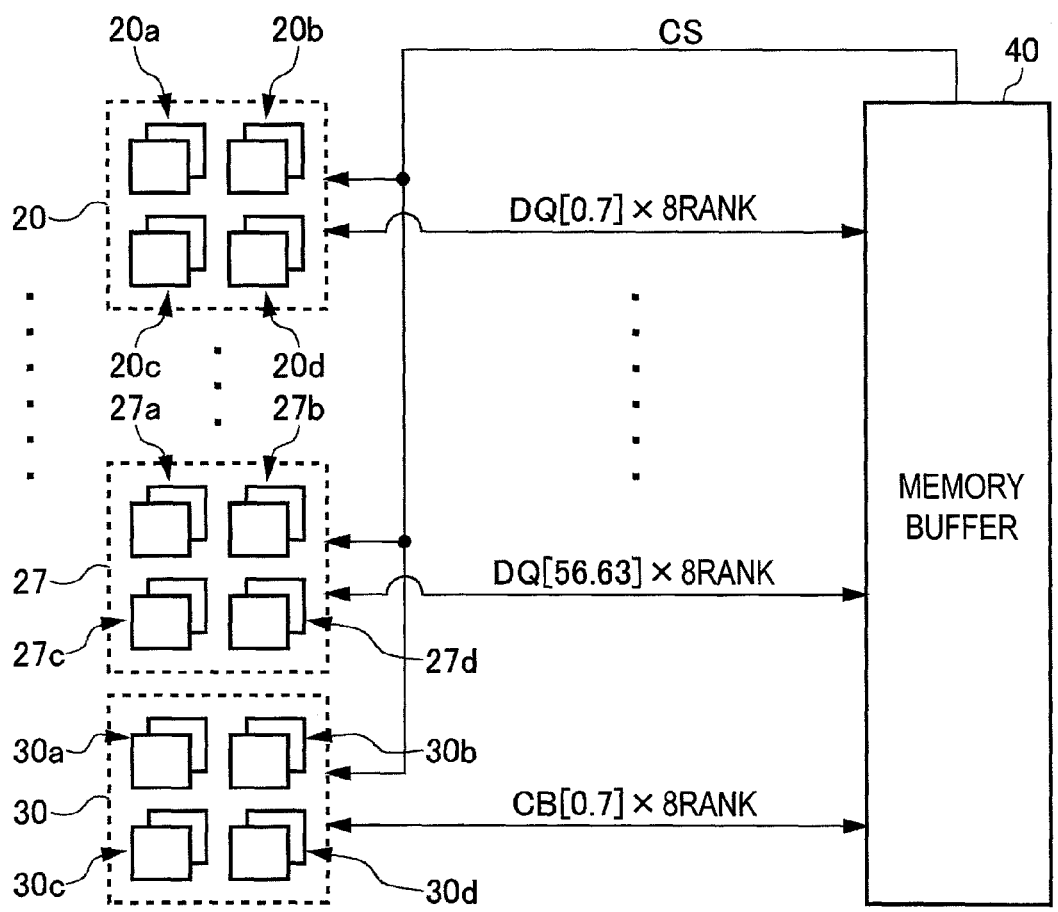
FIG. 3 is a schematic diagram for explaining a connection relationship between memory chip packages and a memory buffer.

FIG. 3 is a schematic diagram for explaining a connection relationship between memory chip packages and a memory buffer.

As shown in FIG. 3, any one of eight regular chips included in the regular chip packages 2ia to 2id is selected by the chip selection signal CS, and 8-bit user data DQ is allocated to a selected regular chip. Specifically, DQ [$8i$ to $8i+7$] is allocated to a selected memory chip. Similarly, any one of eight error-correction chips included in the error-correction chip packages 30a to 30d is selected by the chip selection signal CS, and the 8-bit error-correction code CB [0, 7] is allocated to a selected error-correction chip.

The memory chip 40 is mounted in the mounting area A4 of the main surface 11a, and a regular chip package and an error-correction chip package are not mounted in the mounting area A4 of the other main surface 11b as the back surface. As described above, the memory buffer 40 is a circuit that buffers various signals transmitted and received between the memory chip packages 2ia to 2id, and the error-correction chip packages 30a to 30d and the external terminals 12. In the present embodiment, not only a data signal including user data and an error correction code, but also an address signal, a command signal and a clock signal are buffered by the memory buffer 40. However, in the present invention, an address signal, a command signal and a clock signal can be also arranged to be buffered by a separate memory buffer.

A terminating resister 13 to terminate an address signal, a command signal and a clock signal is provided at an end of the modulate substrate 11 in the X direction. That is, an address signal, a command signal and a clock signal input from the external terminals 12 are buffered by the memory buffer 40, and the buffered signals are supplied to regular chips and error correction chips by an on-the-fly (continuous) connection, and are finally terminated by the terminating resistor 13. On the other hand, a data signal (user data and an error correction code) is terminated by an ODT (On Die Termination) function held by regular chips and error correction chips.

The layout of the memory module 10 according to the present embodiment is as explained above. The connection between the memory buffer 40 and the memory chip packages 2ia to 2id and 30a to 30d is explained next.

Figure 4A:
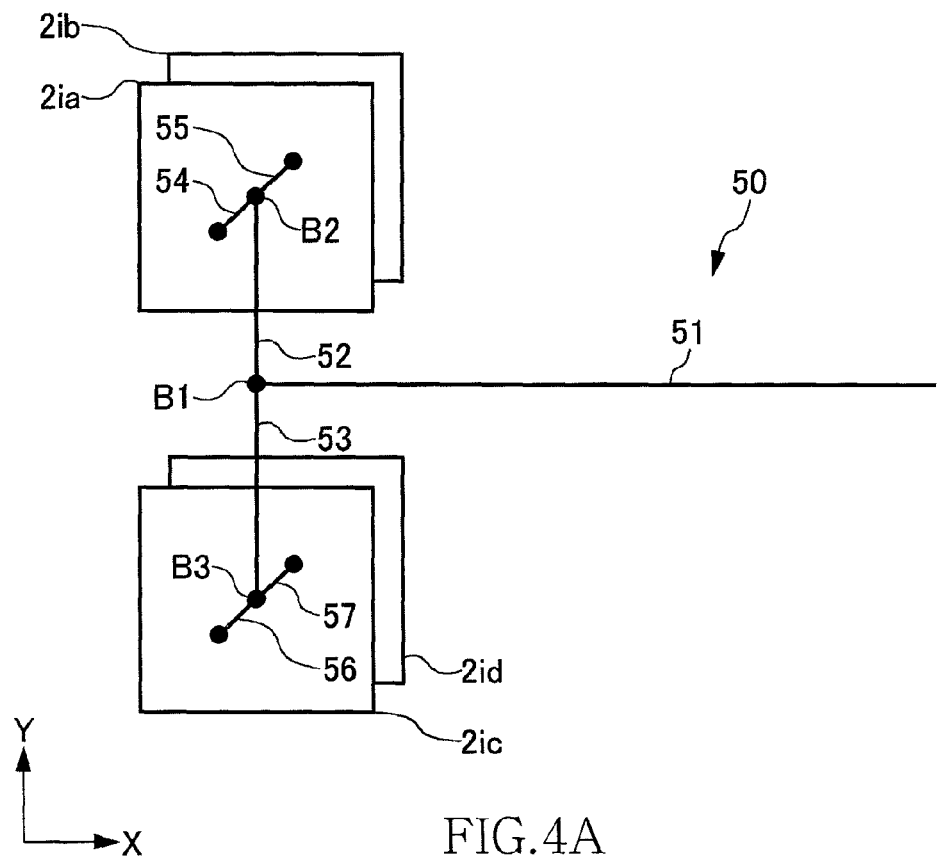
FIG. 4A is a schematic diagram of a data wiring 50 that connects the memory buffer 40 and the regular chip packages 2ia to 2id.
Figure 4B:
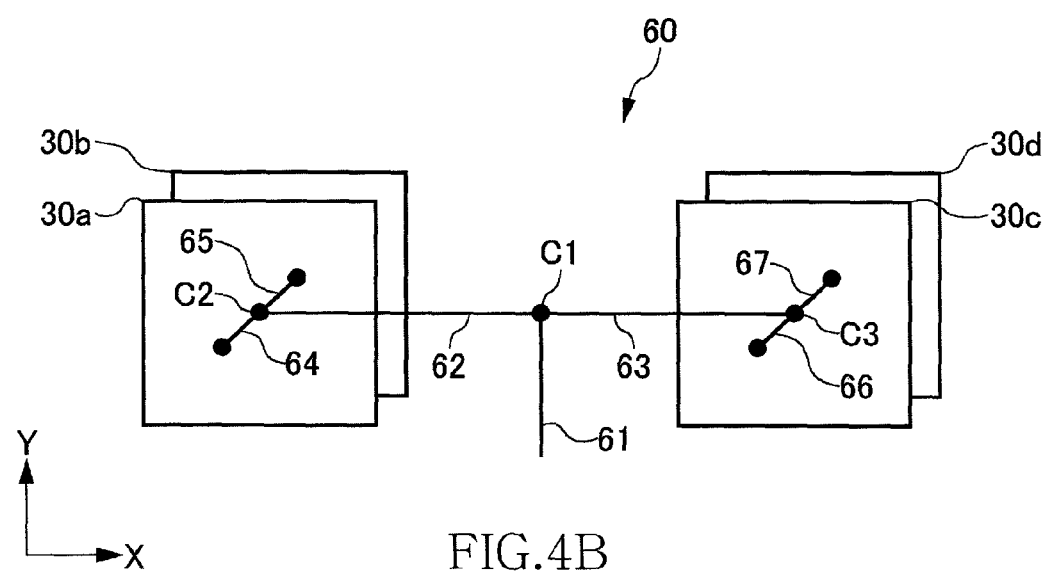
FIG. 4B is a schematic diagram of a data wiring 60 that connects the memory buffer 40 and the error-correction chip packages 30a to 30d.

FIG. 4A is a schematic diagram of a data wiring 50 that connects the memory buffer 40 and the regular chip packages 2ia to 2id, and FIG. 4B is a schematic diagram of a data wiring 60 that connects the memory buffer 40 and the error-correction chip packages 30a to 30d.

As shown in FIG. 4A, the data wiring 50 is configured by wiring portions 51 to 57. The wiring portion 51 is commonly allocated to the regular chip packages 2ia to 2id, and is branched to wiring portions 52 and 53 at a branch point B1. The wiring portion 52 is commonly allocated to the regular chip packages 2ia and 2ib, and is branched to wiring portions 54 and 55 at a branch point B2. Similarly, the wiring portion 53 is commonly allocated to the regular chip packages 2ic and 2id, and is branched to wiring portions 56 and 57 at a branch point B3.

The wiring portion 51 is mainly extended to the X direction, and is provided within the module substrate 11 having a multilayer wiring structure. The wiring portions 52 and 53 are mainly extended to the Y direction, and are provided within the module substrate 11 having a multilayer wiring structure. Therefore, the branch point B1 that becomes one end of the wiring portions 52 and 53 is formed within the module substrate 11. On the other hand, the branch points B2 and B3 that becomes the other end of the wiring portions 52 and 53 are positioned in a through-hole conductor penetrating through the module substrate 11. One end of a through-hole conductor that constitutes the branch point B2 is connected to the regular chip package 2ia via a wiring portion 54 provided on the main surface 11a, and the other end of the through-hole conductor that constitutes the branch point B2 is connected to the regular chip package 2ib via a wiring portion 55 provided on the other main surface 11b. One end of a through-hole conductor that constitutes the branch point B3 is connected to the regular chip package 2ic via a wiring portion 56 provided on the main surface 11a, and the other end of the through-hole conductor that constitutes the branch point B3 is connected to the regular chip package 2id via a wiring portion 57 provided on the other main surface 11b.

Figure 5:
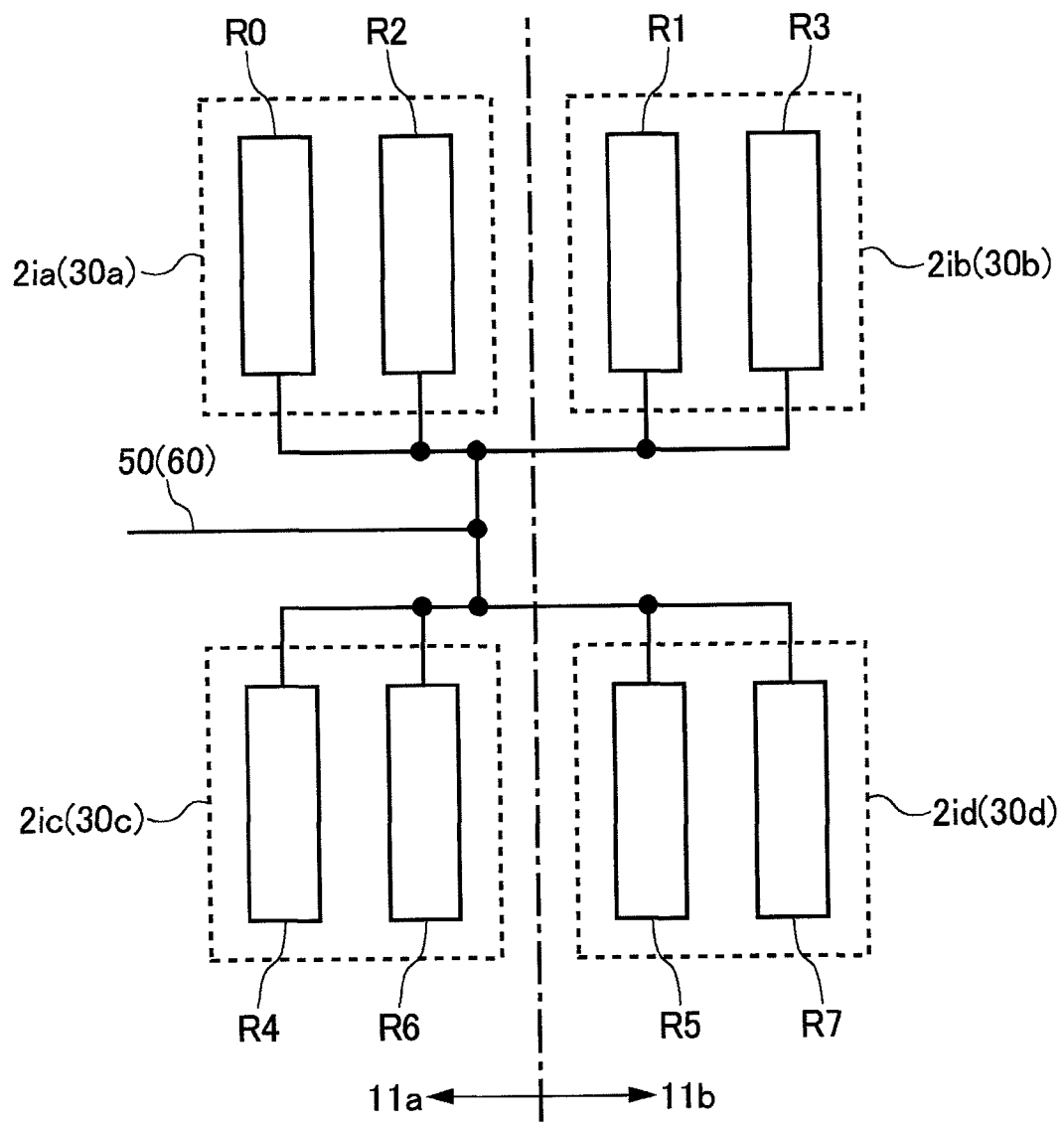
FIG. 5 is a schematic diagram for explaining a connection relationship between regular chip packages.

As described above, because two regular chips are packaged in one regular chip package, one data wiring 50 is commonly connected to eight regular chips R0 to R7 in total as shown in FIG. 5. Any one of the eight regular chips R0 to R7 is selected based on a chip selection signal. A data input/output terminal of an unselected regular chip becomes in a high impedance state or functions as a terminating resistor based on the ODT function.

As shown in FIG. 4B, the data wiring 60 is configured by wiring portions 61 to 67. The wiring portion 61 is commonly allocated to the error-correction chip packages 30a to 30d, and is branched to the wiring portions 62 and 63 at a branch point C1. The wiring portion 62 is commonly allocated to the error-correction chip packages 30a and 30b, and is branched to the wiring portions 64 and 65 at a branch point C2. Similarly, the wiring portion 63 is commonly allocated to the error-correction chip packages 30c and 30d, and is branched to the wiring portions 66 and 67 at a branch point C3.

The wiring portion 61 is mainly extended to the Y direction, and is provided within the module substrate 11 having a multilayer wiring structure. The wiring portions 62 and 63 are mainly extended to the X direction, and are provided within the module substrate 11 having a multilayer wiring structure. Therefore, the branch point C1 that becomes one end of the wiring portions 62 and 63 is formed within the module substrate 11. On the other hand, the branch points C2 and C3 that becomes the other end of the wiring portions 62 and 63 are positioned in a through-hole conductor penetrating through the module substrate 11. One end of a through-hole conductor that constitutes the branch point C2 is connected to the error-correction chip package 30a via the wiring portion 64 provided on the main surface 11a, and the other end of the through-hole conductor that constitutes the branch point C2 is connected to the error-correction chip package 30b via the wiring portion 65 provided on the other main surface 11b. One end of a through-hole conductor that constitutes the branch point C3 is connected to the error-correction chip package 30c via the wiring portion 66 provided on the main surface 11a, and the other end of the through-hole conductor that constitutes the branch point C3 is connected to the error-correction chip package 30d via the wiring portion 67 provided on the other main surface 11b.

In a similar manner to the regular chip packages, because two error-correction chips are packaged in one error-correction chip package, one data wiring 60 is commonly connected to eight error-correction chips R0 to R7 in total as shown in FIG. 5. Any one of the eight error-correction chips R0 to R7 is selected based on a chip selection signal. A data input/output terminal of an unselected error-correction chip becomes in a high impedance state or functions as a terminating resistor based on the ODT function.

Figure 6:
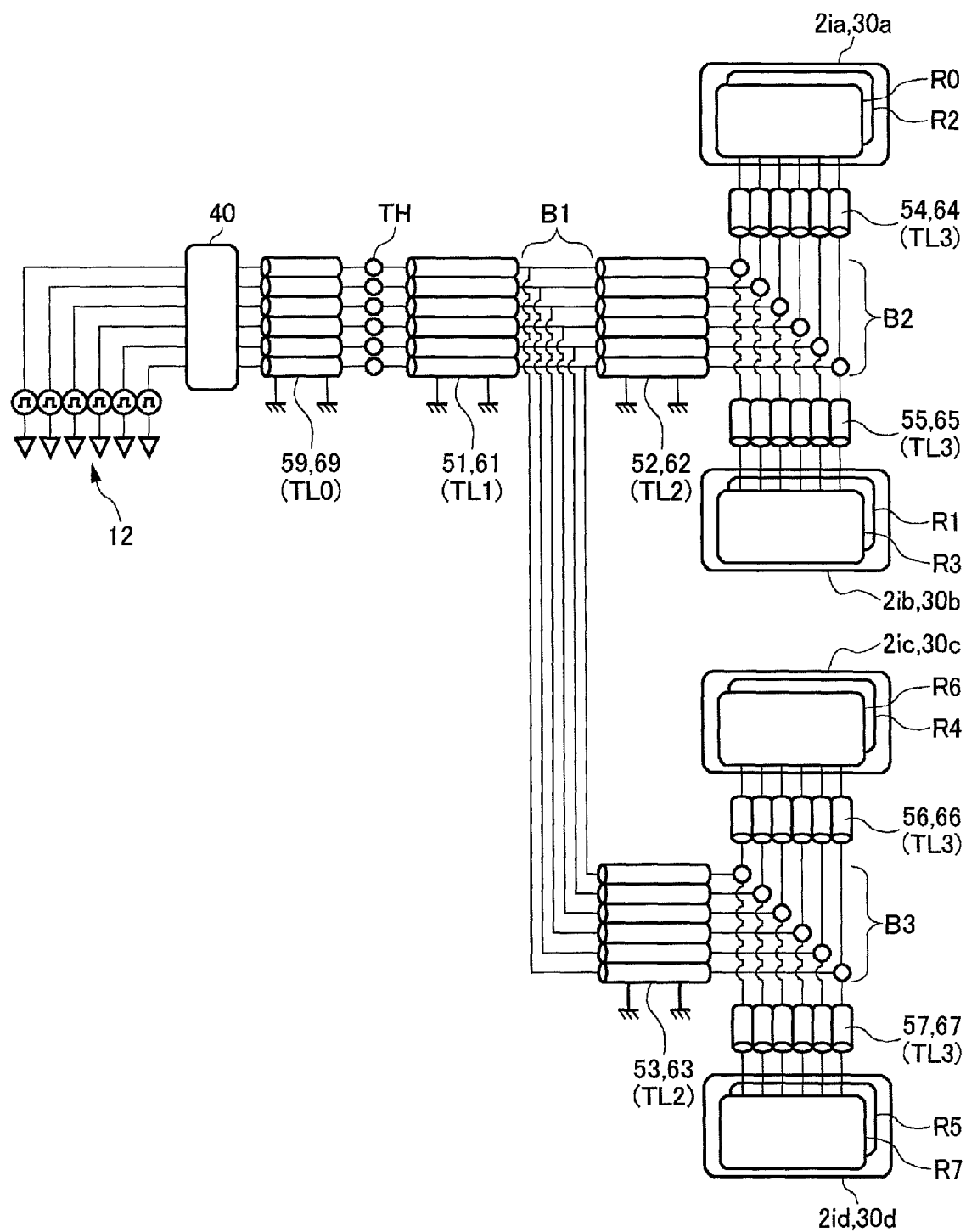
FIG. 6 is another schematic diagram of the data wirings 50 and 60.

FIG. 6 is another schematic diagram of the data wirings 50 and 60. FIG. 6 also shows wiring portions 59 and 69 that connect the memory buffer 40 and the wiring portions 51 and 61, respectively. The wiring portions 59 and 69 are provided on the main surface 11a, one end of each of the wiring portions 59 and 69 is connected to the memory buffer 40, and the other end of each of the wiring portions 59 and 69 is connected to the wiring portions 51 and 61 via a through-hole conductor TH.

As described above, the number of branch points and a branch method of the data wiring 50 are the same as those of the data wiring 60, except the part of wiring portions, the extension direction, and the length are different. That is, topologies of the data wirings 50 and 60 match each other. Accordingly, the signal quality of user data transferred through the data wiring 50 and that of an error correction code transferred through the data wiring 60 can be satisfied at the same time. As a result, a high data transfer rate can be achieved.

Figure 7:
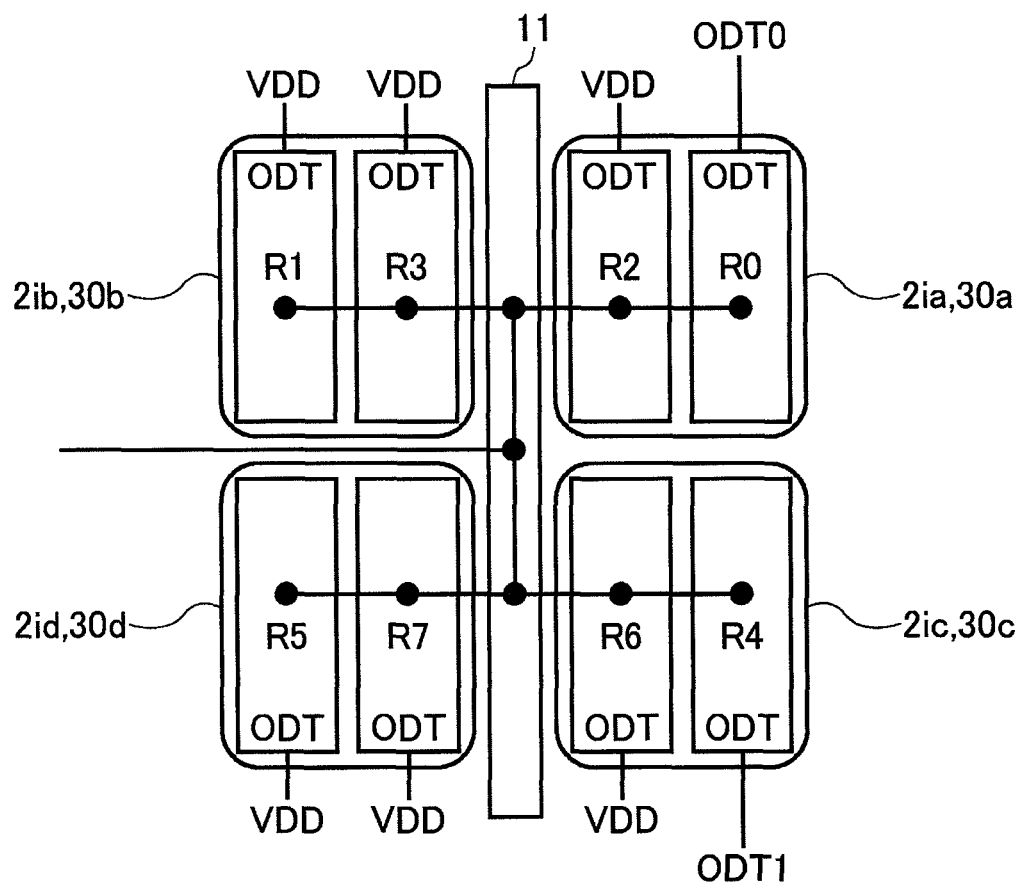
FIG. 7 is a schematic diagram for explaining a method of an ODT control of the eight memory chips R0 to R7.

FIG. 7 is a schematic diagram for explaining a method of an ODT control of the eight memory chips R0 to R7.

Figure 27:
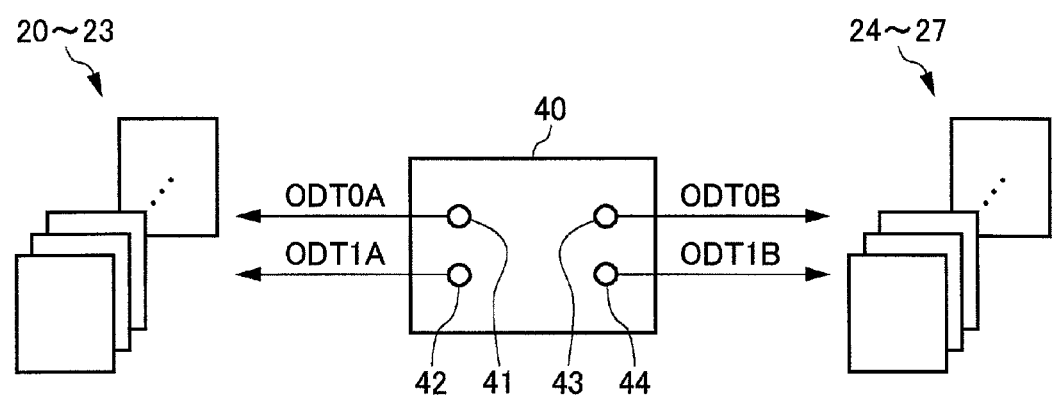
FIG. 27 is a schematic diagram for explaining supply destinations of termination control signals output from four ODT terminals 41 to 44.

In an example shown in FIG. 7, termination control signals ODT0 and ODT1 are supplied to the memory chips R0 and R4, respectively. Termination control signals are not supplied to other memory chips R1 to R3 and R5 to R7, and corresponding terminals are fixed at a VDD level. That is, in the present example, two termination control signals ODT0 and ODT1 are used. More specifically, four ODT terminals 41 to 44 are provided in the memory buffer 40 as shown in FIG. 27. Termination control signals ODT0A and ODT1A to be supplied to regular chip packages 20 to 23 (specifically, 20a to 23a and 20c to 23c) are output from two ODT terminals 41 and 42 out of the four ODT terminals. Termination control signals ODT0B and ODT1B to be supplied to regular chip packages 24 to 27 (specifically, 24a to 27a and 24c to 27c) are output from the rest two ODT terminals 43 and 44. The termination control signals ODT0A and ODT1A are independently controlled, respectively, and the termination control signals ODT0B and ODT1B are also independently controlled, respectively. Meanwhile, the termination control signals ODT0A and ODT0B are the same signals, and the termination control signals ODT1A and ODT1B are the same signals.

One of the termination control signals ODT0 and ODT1 becomes active during a read operation as shown in FIG. 8, thereby setting terminating resistance values of the memory chips R0 to R7 at a predetermined value (20Ω in the example shown in FIG. 8) during a read operation. One of the termination control signals ODT0 and ODT1 becomes active during a write operation, and terminating resistance values of memory chips to be written become at a predetermined value (120Ω in the example shown in FIG. 8). In the example shown in FIG. 8, a terminating resistance value of the memory buffer 40 is set at 60Ω during a read operation.

Figure 9A:
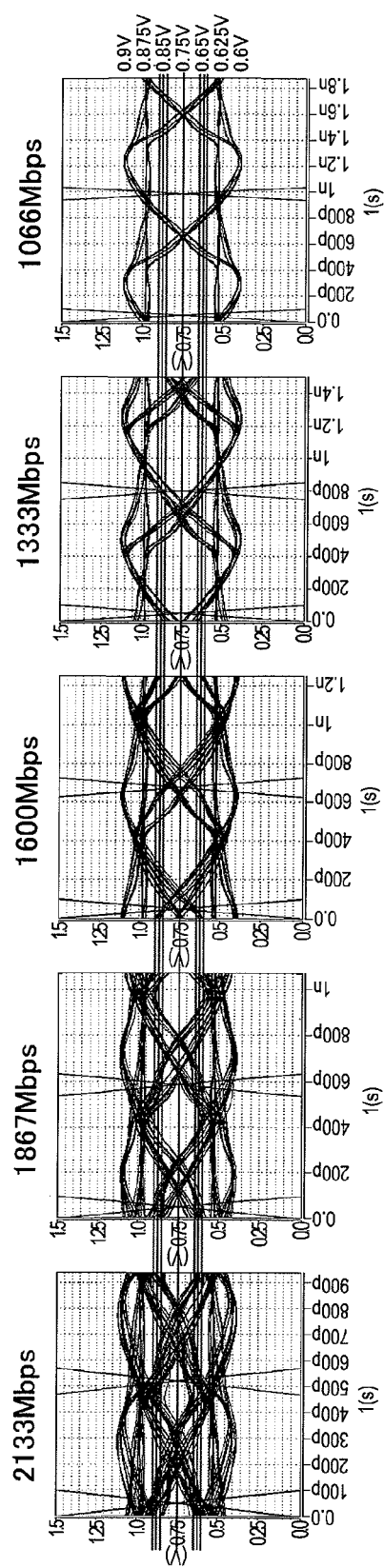
FIGS. 9A and 9B are simulation waveform diagrams showing signal qualities during a read operation of the memory module 10, where
Figure 9B:
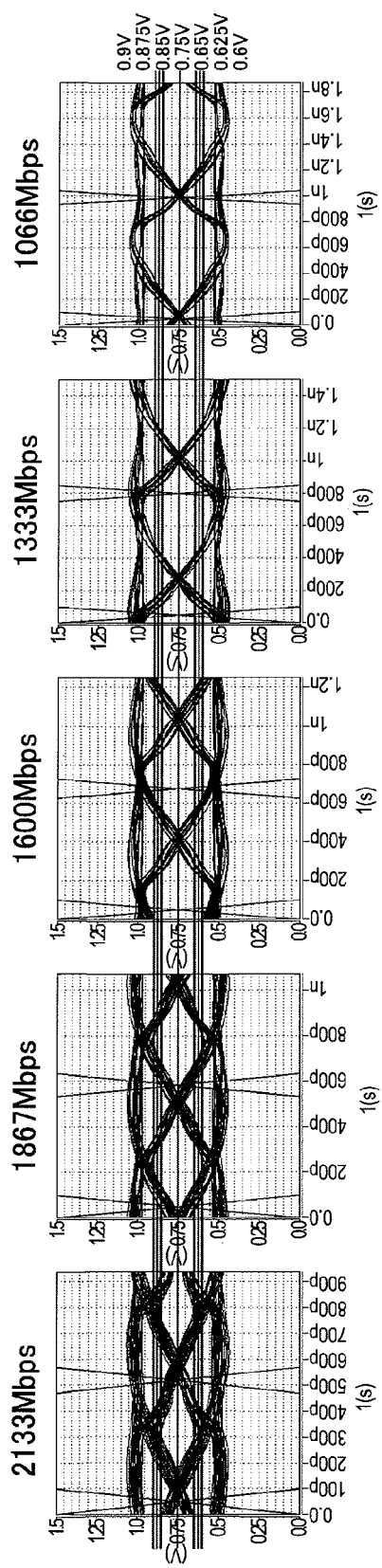
Figure 10A:
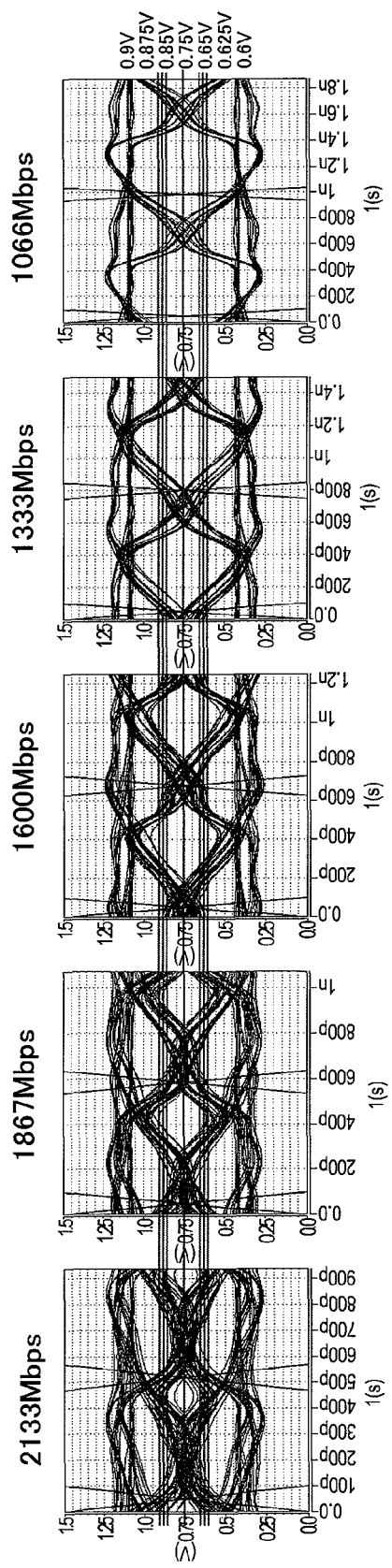
FIGS. 10A and 10B are simulation waveform diagrams showing signal qualities during a write operation of the memory module 10, where
Figure 10B:
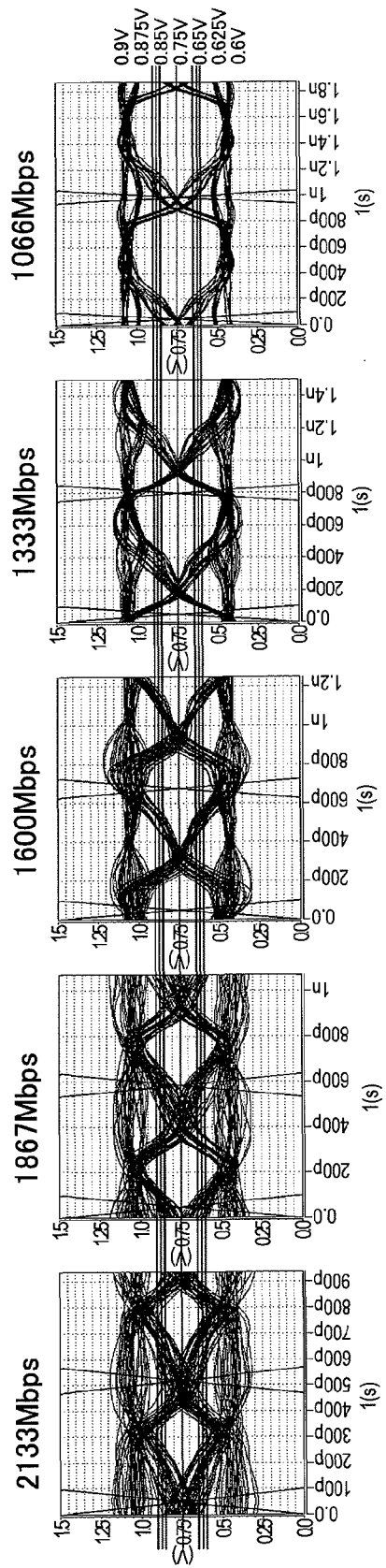

FIGS. 9A and 9B are simulation waveform diagrams showing signal qualities during a read operation of the memory module 10 according to the present embodiment, where FIG. 9A shows signal waveforms of data signals transferred to memory chips nearest to the memory buffer 40, and FIG. 9B shows signal waveforms of data signals transferred to memory chips farthest from the memory buffer 40. FIGS. 10A and 10B are simulation waveform diagrams showing signal qualities during a write operation of the memory module 10 according to the present embodiment, where FIG. 10A shows signal waveforms of data signals read from memory chips nearest to the memory buffer 40, and FIG. 10B shows signal waveforms of data signals read from memory chips farthest from the memory buffer 40. Simulation conditions are as shown in FIG. 11. The memory chips nearest to the memory buffer 40 are the error correction chips 30a to 30d, and the memory chips farthest from the memory buffer 40 are the regular chips 20a to 20d or 27a to 27d arranged at an end of the module substrate 11 in the X direction. In FIG. 11, the wiring portions 59 and 69 are denoted as TL0, the wiring portions 51 and 61 are denoted as TL1, the wiring portions 52, 53, 62, and 63 are denoted as TL2, and the wiring portions 54 to 57 and 64 to 67 are denoted as TL3 (see FIG. 6).

As shown in FIGS. 9 and 10, it is confirmed that, in the present embodiment, a satisfactory signal quality is obtained at high data transfer rates (up to 2133 Mbps) both during read and write operations. That is, it is confirmed that the signal quality of user data transferred through the data wiring 50 and that of an error correction code transferred through the data wiring 60 can be satisfied at the same time.

Figure 12A:
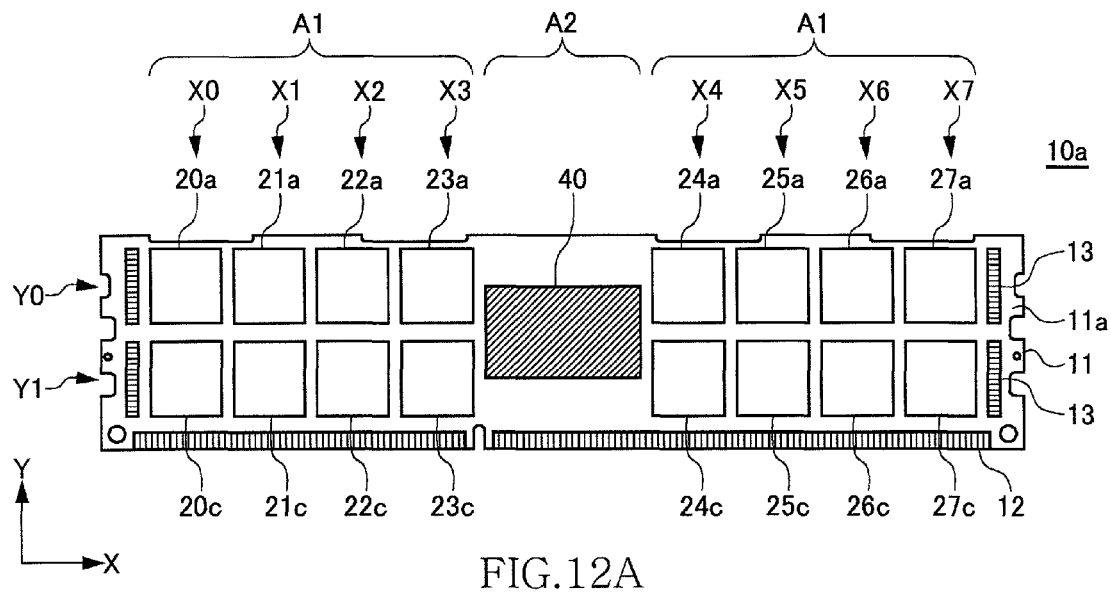
FIGS. 12A and 12B show a structure of a memory module 10a according to a comparative example, where
Figure 12B:
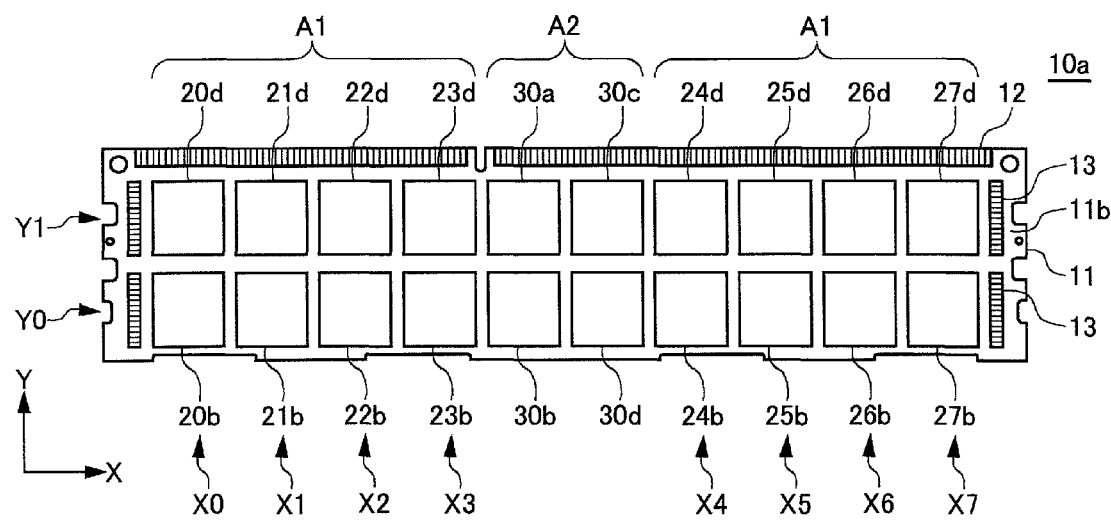

FIGS. 12A and 12B show a structure of a memory module 10a according to a comparative example, where FIG. 12A is a plan view as viewed from the main surface 11a, and FIG. 12B is a plan view as viewed from the other main surface 11b.

As shown in FIGS. 12A and 12B, the memory module 10a according to the comparative example is different from the memory module 10 shown in FIGS. 1A and 1B such that mounting positions of the memory buffer 40 and the error-correction chip packages 30a to 30d are different. Specifically, the memory buffer 40 is arranged at an intermediate portion between the mounting areas Y0 and Y1 of the mounting area A2 on the main surface 11a. The error-correction chip packages 30a to 30d are arranged in a matrix shape in the mounting area A2 of the other main surface 11b.

Figure 13A:
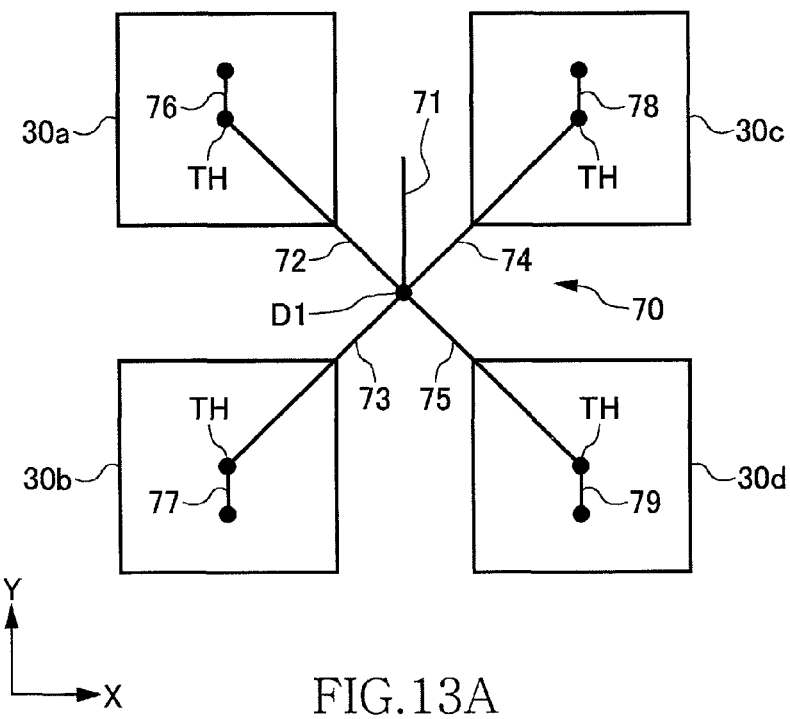
FIGS. 13A and 13B are schematic diagrams of data wirings connecting the memory buffer 40 and the error-correction chip packages 30a to 30d in the memory module 10a according to the comparative example, where
Figure 13B:
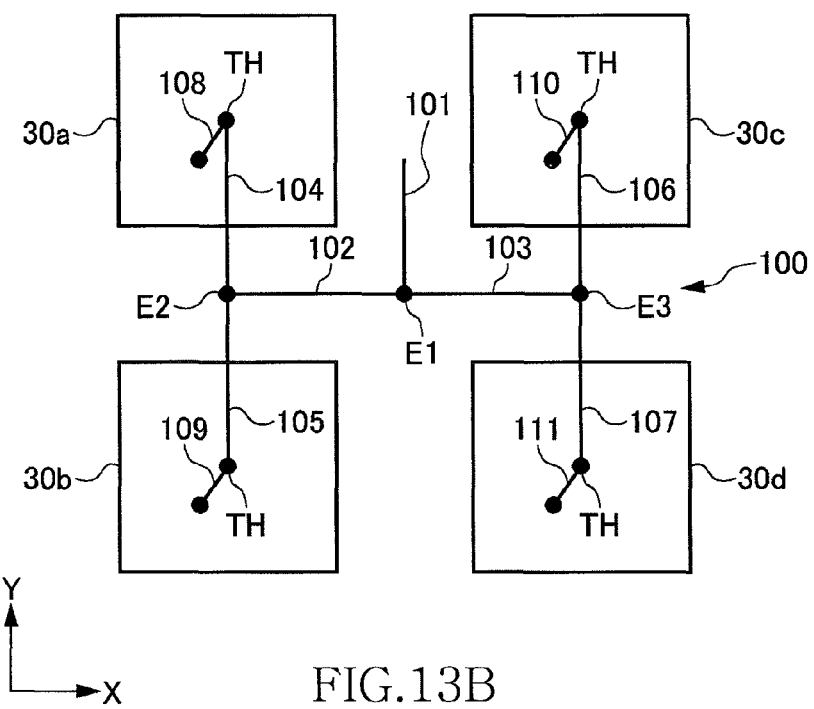
Figure 14:
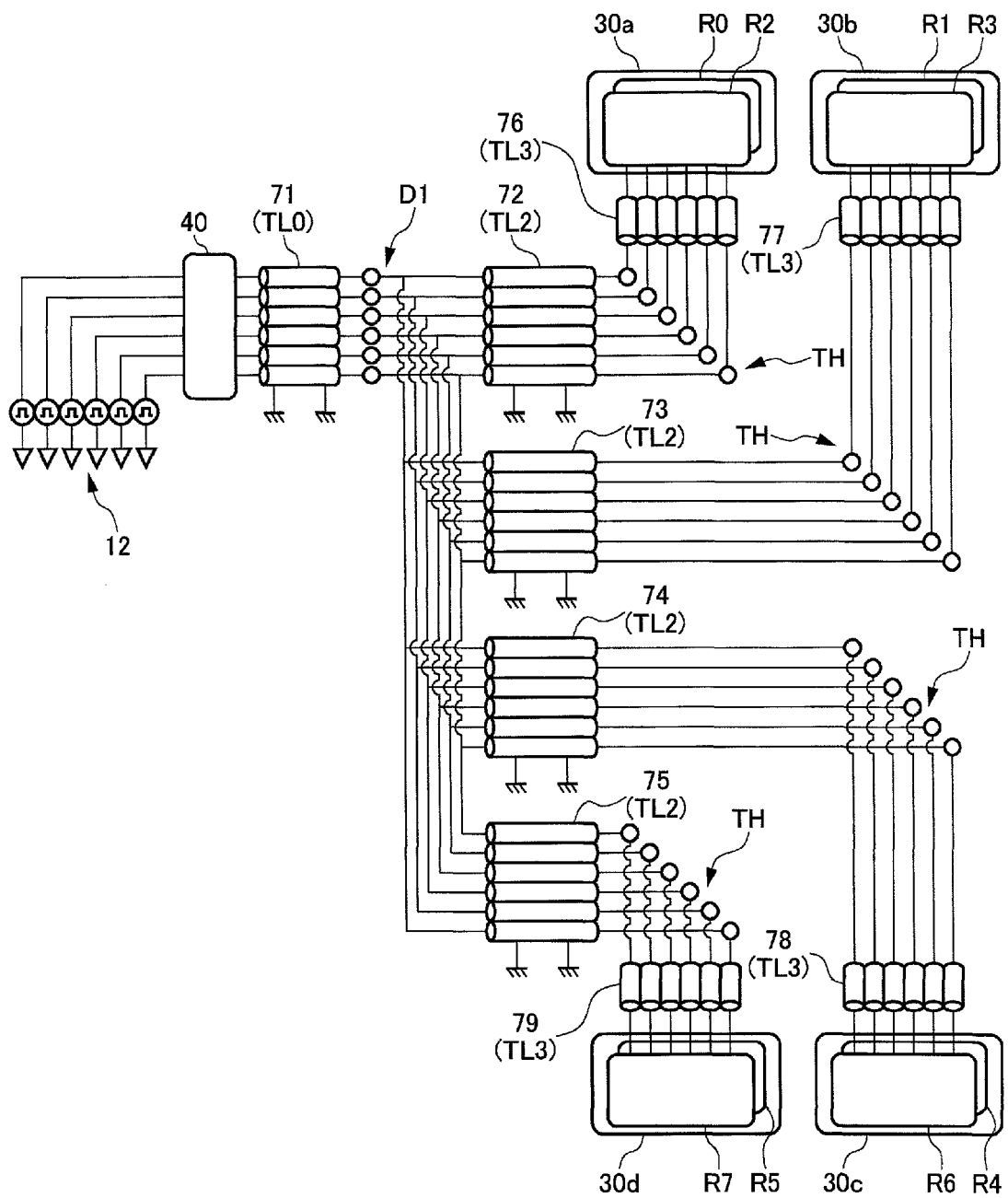
FIG. 14 shows another schematic diagram of a data wiring 70.
Figure 20:
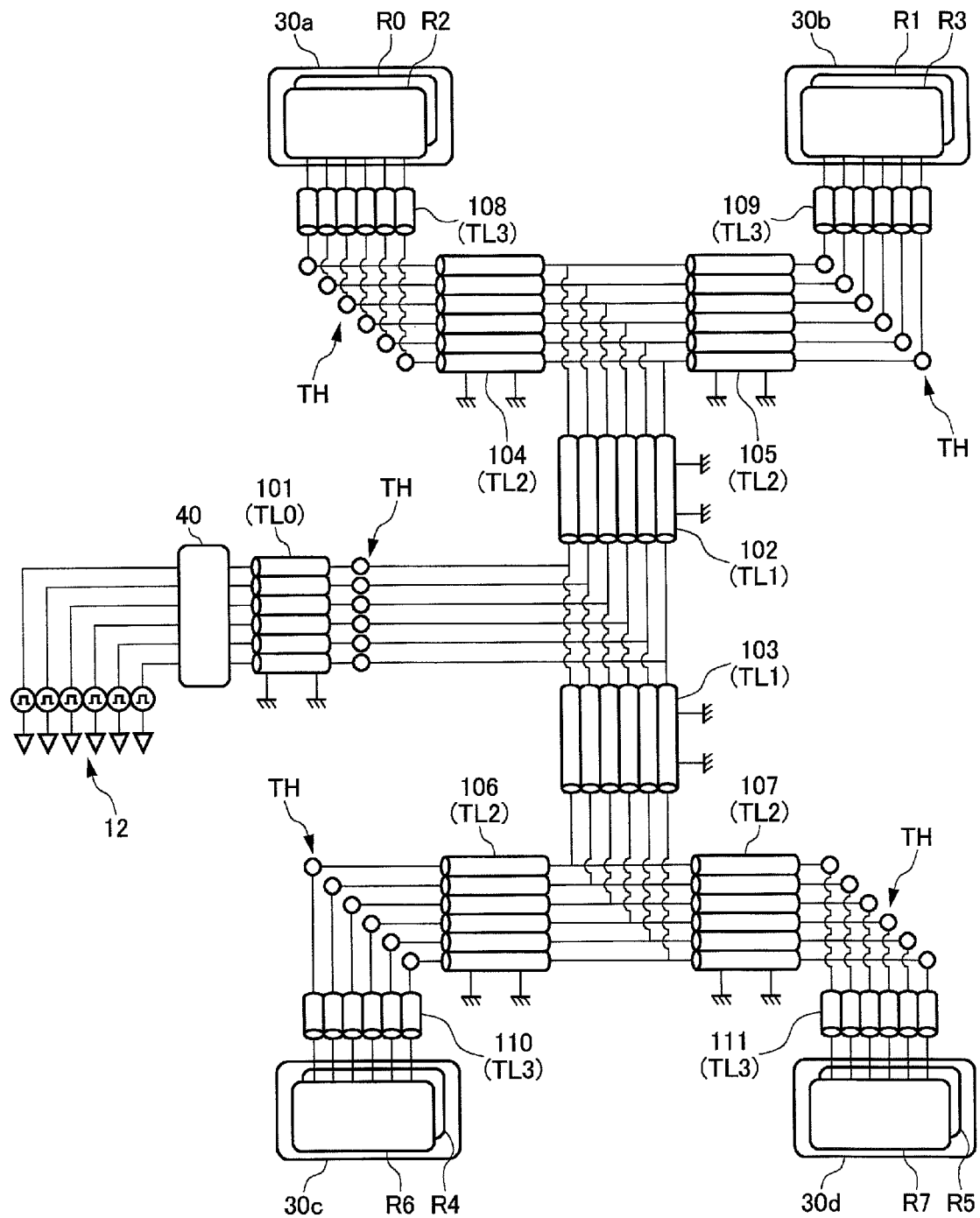
FIG. 20 shows another schematic diagram of a data wiring 100.

FIGS. 13A and 13B are schematic diagrams of data wirings connecting the memory buffer 40 and the error-correction chip packages 30a to 30d in the memory module 10a according to the comparative example, where FIG. 13A shows a first example, and FIG. 13B shows a second example. FIG. 14 shows another schematic diagram of a data wiring 70 shown in FIG. 13A. FIG. 20 shows another schematic diagram of a data wiring 100 shown in FIG. 13B.

In the examples shown in FIGS. 13A and 14, the data wiring 70 is configured by wiring portions 71 to 79. The wiring portion 71 is commonly allocated to the error-correction chip packages 30a to 30d, and is formed on the main surface 11a. The wiring portion 71 is branched to the wiring portions 72 to 75 at a branch point D1 configured by a through-hole conductor. The wiring portions 72 to 75 are individually allocated to the error-correction chip packages 30a to 30d, and are formed within the module substrate 11. The wiring portions 72 to 75 are drawn out to the other main surface 11b via corresponding through-hole conductors TH, and are connected to the error-correction chip packages 30a to 30d via the wiring portions 76 to 79 formed on the other main surface 11b, respectively.

As explained above, a topology of the data wiring 70 shown in FIGS. 13A and 14 is different from a topology of the data wiring 50 shown in FIGS. 4A and 6.

Figure 15:
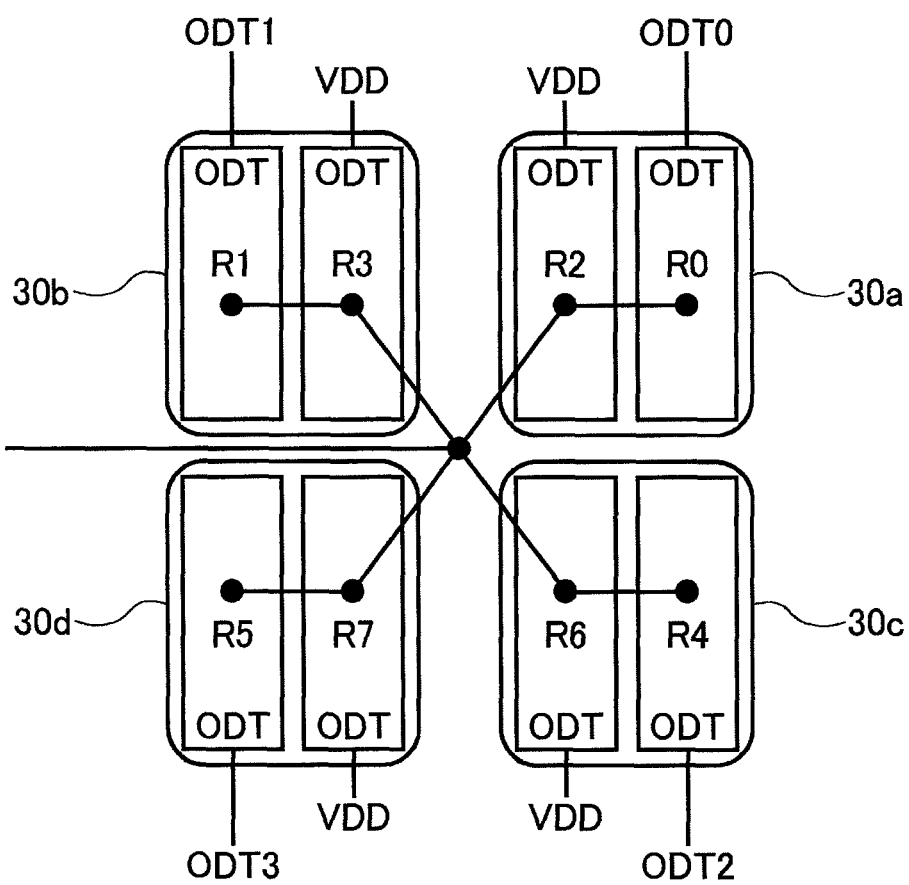
FIG. 15 is a schematic diagram for explaining a method of an ODT control of eight error-correction chips R0 to R7 connected to the data wiring 70.

FIG. 15 is a schematic diagram for explaining a method of an ODT control of eight error-correction chips R0 to R7 connected to the data wiring 70.

In an example shown in FIG. 15, termination control signals ODT0 to ODT3 are supplied to the memory chips R0, R1, R4, and R5, respectively. Termination control signals are not supplied to other memory chips R2, R3, R6, and R7, and corresponding terminals are fixed at a VDD level. That is, in the present example, four termination control signals ODT0 to ODT3 are used.

Any three of the termination control signals ODT0 to ODT3 become active during a read operation as shown in FIG. 16, thereby setting terminating resistance values of the memory chips at a predetermined value (40Ω in the example shown in FIG. 16) during a read operation. Any three of the termination control signals ODT0 to ODT3 become active during a write operation, and terminating resistance values of memory chips to be written become at a predetermined value (120Ω in the example shown in FIG. 16). In the example shown in FIG. 16, a terminating resistance value of the memory buffer 40 is set at 80Ω during a read operation.

Figure 17:
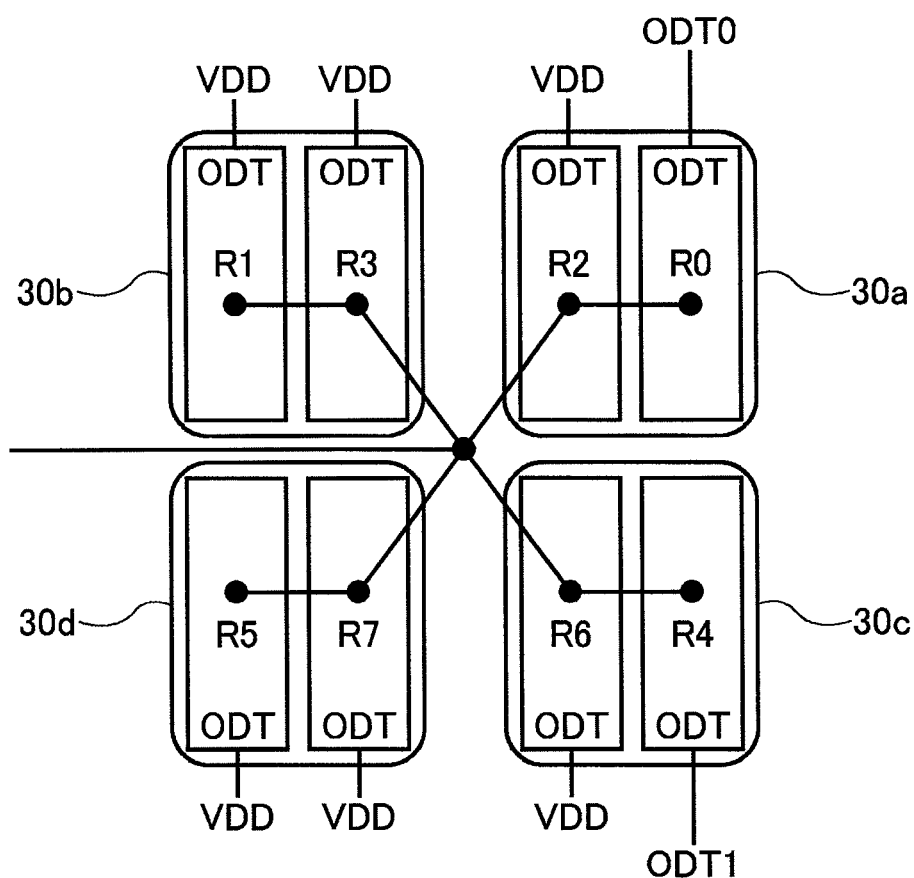
FIG. 17 is another schematic diagram for explaining a method of an ODT control of the eight error-correction chips R0 to R7 connected to the data wiring 70.

FIG. 17 is another schematic diagram for explaining a method of an ODT control of the eight error-correction chips R0 to R7 connected to the data wiring 70.

In an example shown in FIG. 17, the termination control signals ODT0 and ODT1 are supplied to the memory chips R0 and R4, respectively. Termination control signals are not supplied to other memory chips R1 to R3 and R5 to R7, and corresponding terminals are fixed at a VDD level. That is, in the present example, two termination control signals ODT0 and ODT1 are used. A control method of the termination control signals ODT0 and ODT1 is the same as the control method explained with reference to FIG. 8.

Figure 18A:
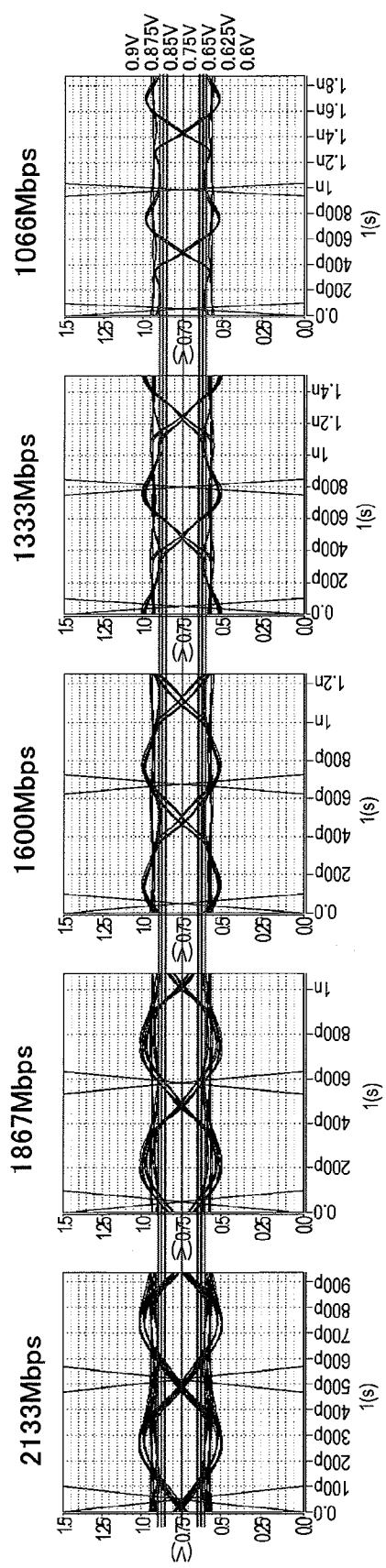
FIGS. 18A and 18B are simulation waveform diagrams showing signal qualities during a read operation of error correction codes transferred through the data wiring 70, where
Figure 18B:
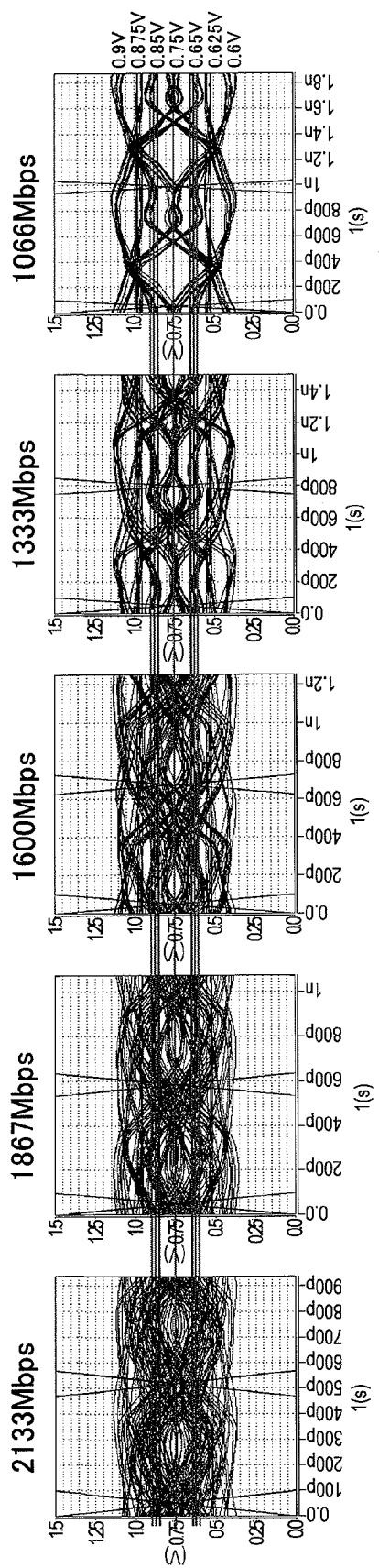

FIGS. 18A and 18B are simulation waveform diagrams showing signal qualities during a read operation of error correction codes transferred through the data wiring 70, where FIG. 18A shows signal waveforms when four terminating control signals ODT0 to ODT3 are used (FIG. 15), and FIG. 18B shows signal waveforms when two terminating control signals ODT0 and ODT1 are used (FIG. 17). FIGS.

Figure 19A:
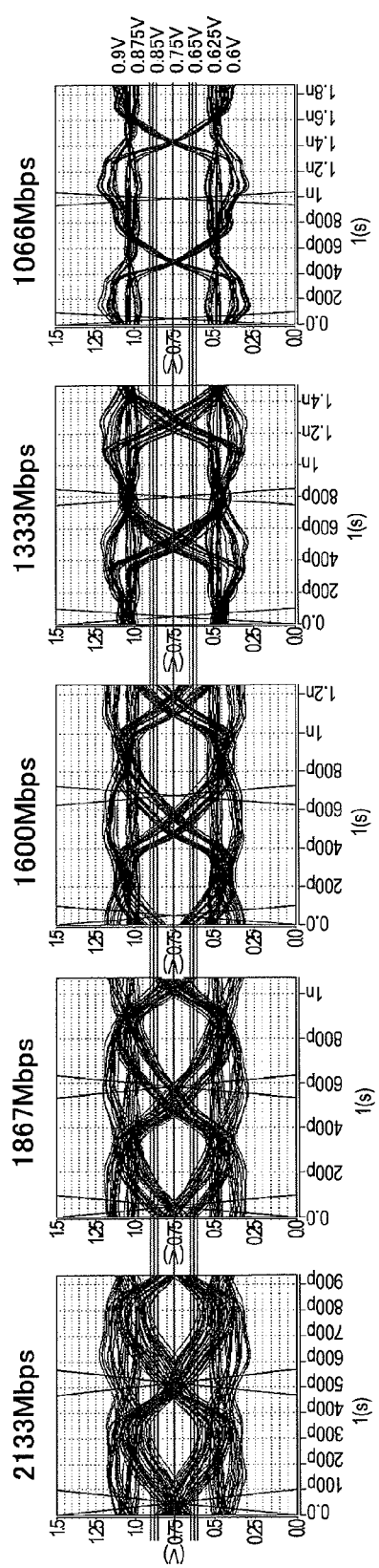
FIGS. 19A and 19B are simulation waveform diagrams showing signal qualities during a write operation of error correction codes transferred through the data wiring 70, where
Figure 19B:
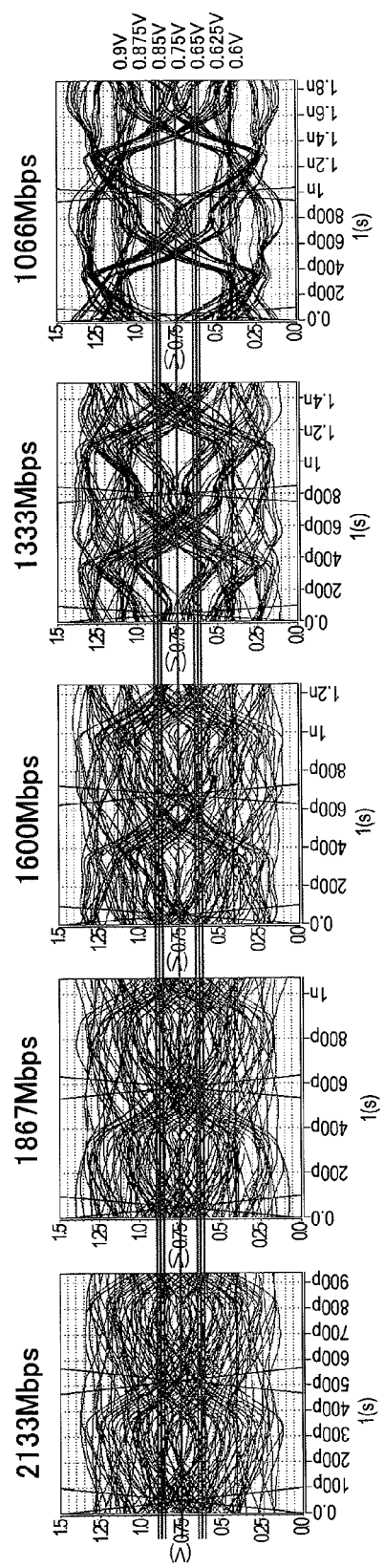

19A and 19B are simulation waveform diagrams showing signal qualities during a write operation of error correction codes transferred through the data wiring 70, where FIG. 19A shows signal waveforms when the four terminating control signals ODT0 to ODT3 are used (FIG. 15), and FIG. 19B shows signal waveforms when the two terminating control signals ODT0 and ODT1 are used (FIG. 17).

Simulation conditions are as shown in FIG. 11, except TL0=0.58 mm, TL2=20.00 mm, TL3=2.32 mm. In the present example, TL0 corresponds to the wiring portion 71, TL2 corresponds to the wiring portions 72 to 75, and TL3 corresponds to the wiring portions 76 to 79 (see FIG. 14). In the present example, there is no wiring portion corresponding to TL1.

As shown in FIGS. 18A and 19A, when the four terminating control signals ODT0 to ODT3 are used (FIG. 15), it is confirmed that a satisfactory signal quality of error correction codes is obtained at high data transfer rates (up to 2133 Mbps) during both read and write operations. On the other hand, as shown in FIGS. 18B and 19B, when the two terminating control signals ODT0 and ODT1 are used (FIG. 17), it is confirmed that a satisfactory signal quality is not obtained during both read and write operations.

As described above, regarding the data wiring 50 connected to the regular chip packages 2ia to 2id, a high signal quality can be obtained when the two terminating control signals ODT0 and ODT1 are used (FIG. 7). This means that the signal quality of user data transferred through the data wiring 50 and that of an error correction code transferred through the data wiring 70 cannot be satisfied at the same time when the data wiring 50 is used for the regular chip packages 2ia to 2id and when the data wiring 70 is used for the error-correction chip packages 30a to 30d. That is, when the two terminating control signals ODT0 and ODT1 are used, the signal quality in the data wiring 70 becomes poor although the signal quality in the data wiring 50 can be secured. On the other hand, when the four terminating control signals ODT0 to ODT3 are used, the signal quality in the data wiring 50 becomes poor although the signal quality in the data wiring 70 can be secured. To avoid this problem, it is necessary to control such that the two terminating control signals ODT0 and ODT1 are used for the regular chip packages 2ia to 2id and the four terminating control signals ODT0 to ODT3 are used for the error-correction chip packages 30a to 30d. However, this control is considerably complex and is not supported by the current standard, and thus it is therefore difficult to be applied.

Meanwhile, in the examples shown in FIGS. 13B and 20, the data wiring 100 is configured by wiring portions 101 to 111. The wiring portion 101 is commonly allocated to the error-correction chip packages 30a to 30d, and is formed on the main surface 11a. The wiring portion 101 is branched to the wiring portions 102 and 103 mainly extended to the X direction at a branch point E1. The wiring portion 102 is commonly allocated to the error-correction chip packages 30a and 30b and is branched to the wiring portions 104 and 105 mainly extended to the Y direction at a branch point E2. Similarly, the wiring portion 103 is commonly allocated to the error-correction chip packages 30c and 30d and is branched to the wiring portions 106 and 107 mainly extended to the Y direction at a branch point E3. The wiring portions 104 to 107 are individually allocated to the error-correction chip packages 30a to 30d, respectively, are drawn out to the other main surface 11b via respective through-hole conductors TH, and are connected to the error-correction chip packages 30a to 30d via the wiring portions 108 to 111 formed on the other main surface 11b.

As explained above, a topology of the data wiring 70 shown in FIGS. 13B and 20 is also different from a topology of the data wiring 50 shown in FIGS. 4A and 6.

Figure 21A:
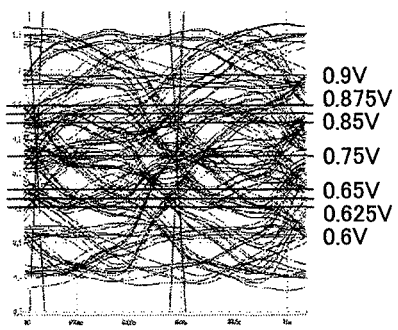
FIGS. 21A and 21B are simulation waveform diagrams showing signal qualities of error correction codes transferred through the data wiring 100 when the two terminating control signals ODT0 and ODT1 are used, where
Figure 21B:
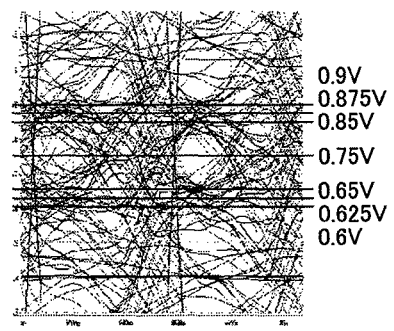

FIGS. 21A and 21B are simulation waveform diagrams showing signal qualities of error correction codes transferred through the data wiring 100 when the two terminating control signals ODT0 and ODT1 are used, where FIG. 21A shows waveforms during a read operation, and FIG. 21B shows waveforms during a write operation. Data transfer rates are 1866 Mbps in both cases.

Simulation conditions are as shown in FIG. 11, except TL0=0.58 mm, TL1=10.00 mm, TL2=12.00 mm, and TL3=2.32 mm. In the present example, TL0 corresponds to the wiring portion 101, TL1 corresponds to the wiring portions 102 and 103, TL2 corresponds to the wiring portions 104 to 107, and TL3 corresponds to the wiring portions 108 to 111 (see FIG. 20).

As shown in FIGS. 21A and 21B, when the two terminating control signals ODT0 and ODT1 are used, it is confirmed that a satisfactory signal quality is not obtained during a read operation and a write operation. This means that the signal quality of user data transferred through the data wiring 50 and that of an error correction code transferred through the data wiring 100 cannot be satisfied at the same time when the data wiring 50 is used for the regular chip packages 2ia to 2id and when the data wiring 100 is used for the error-correction chip packages 30a to 30d.

As explained above, in the memory module 10a according to the comparative example, the signal quality of user data and that of an error correction code cannot be satisfied at the same time when the data wiring 70 shown in FIG. 13A is used and also when the data wiring 100 shown in FIG. 13B is used. On the other hand, in the memory module 10 according to the present embodiment, as explained above, because the topology of the data wiring 50 that transfers user data matches the topology of the data wiring 60 that transfers an error correction code, the signal quality of user data and that of an error correction code can be satisfied at the same time. As a result, a high data transfer rate can be achieved.

Figure 22A:
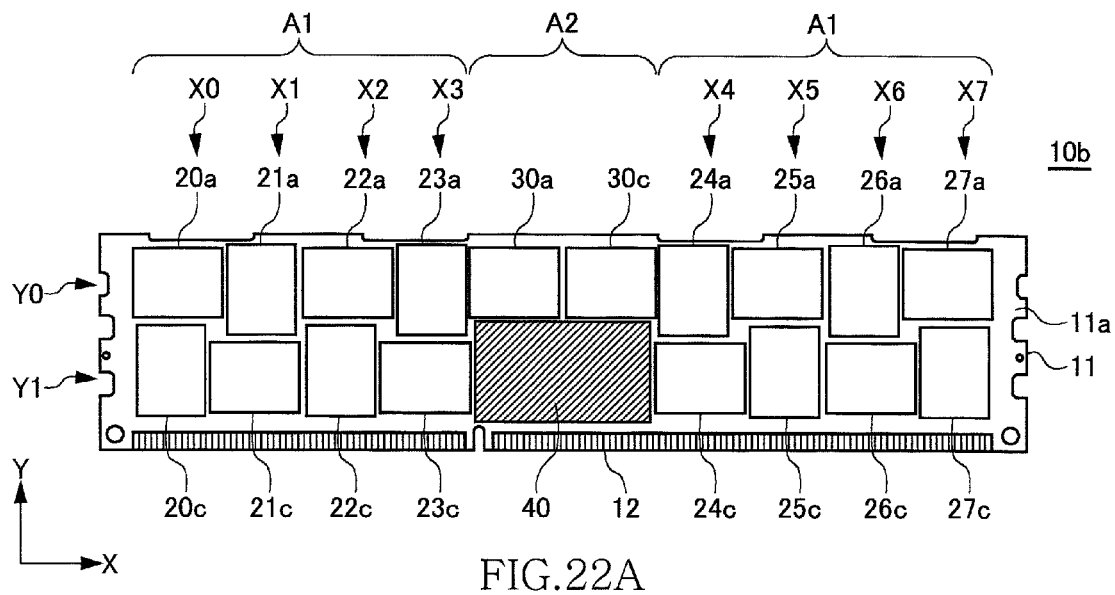
FIGS. 22A and 22B show a structure of a memory module 10b according to a modification of the present invention, where
Figure 22B:
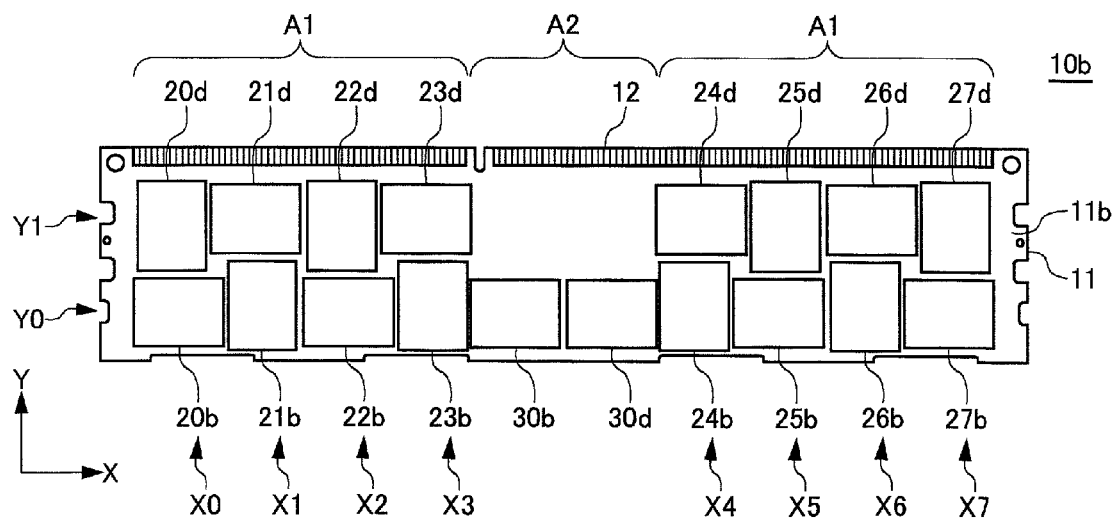

FIGS. 22A and 22B show a structure of a memory module 10b according to a modification of the present invention, where FIG. 22A shows a plan view as viewed from the main surface 11a, and FIG. 22B is a plan view as viewed from the other main surface 11b.

The memory module 10b shown in FIGS. 22A and 22B is different from the memory module 10 shown in FIGS. 1A and 1B in that the planar shape of the memory chip packages 2ia to 2id and 30a to 30d is rectangle. Other features of the memory module 10b are identical to those of the memory module 10 shown in FIG. 1, and thus like elements are denoted by like reference numerals and redundant explanations thereof will be omitted.

As shown in FIGS. 22A and 22B, when the planar shape of the memory chip packages 2ia to 2id and 30a to 30d is rectangle, memory chip packages can be arranged in a closest arrangement by rotating 90 degrees a direction of memory chip packages adjacent in the X direction and Y direction. However, the error-correction chip packages 30a to 30d secure a mounting area of the memory buffer 40 by arranging such that long sides become in the X direction. As explained above, in the present invention, the planar shape of memory chip packages is not particularly limited.

Figure 23A:
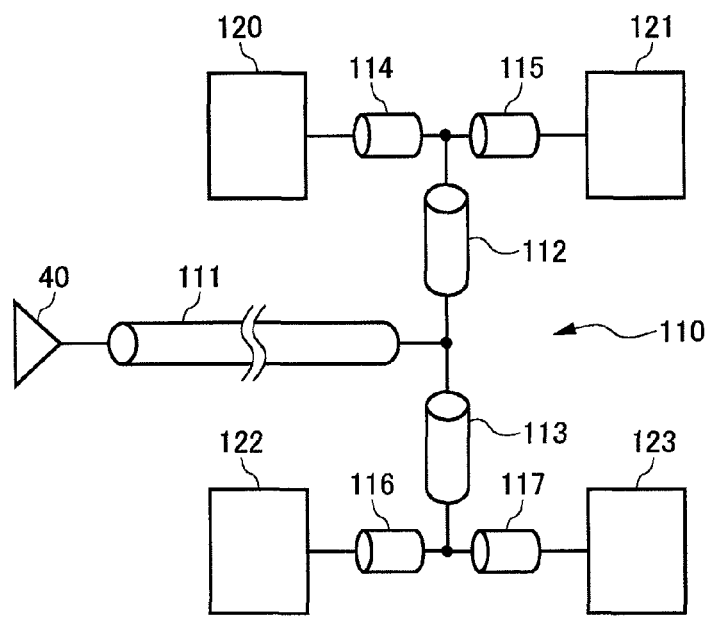
FIGS. 23A and 23B show an example that the present invention is applied to a four-rank product (R0 to R3), where
Figure 23B:
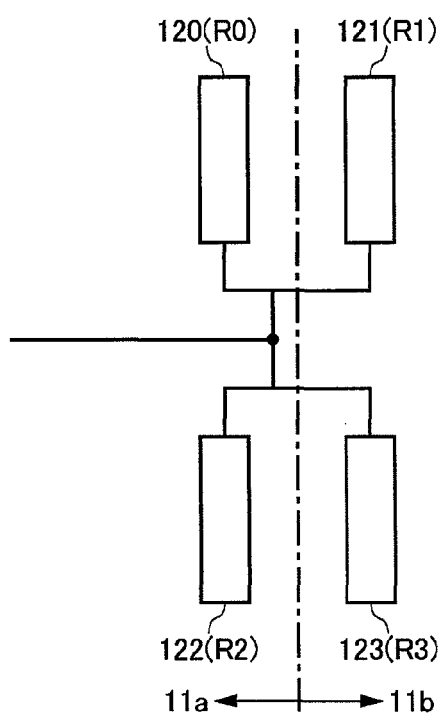

FIGS. 23A and 23B show an example that the present invention is applied to a four-rank product (R0 to R3), where FIG. 23A shows a structure of a data wiring 110, and FIG. 23B shows mounting positions of packages 120 to 123. In the example shown in FIGS. 23A and 23B, a memory module is the same as the memory module 10 described above except that one memory chip is packaged in one memory chip package. Wiring portions 111 to 117 shown in FIG. 23A correspond to the wiring portions 51 to 57 shown in FIG. 4A and the wiring portions 61 to 67 shown FIG. 4B. As shown in FIG. 23B, the package 120 and the package 121 are oppositely arranged on the surface and the back surface of the module substrate 11. Similarly, the package 122 and the package 123 are oppositely arranged on the surface and the back surface of the module substrate 11. As explained above, in the present invention, it is not essential to use a memory chip package in which two memory chips are packaged, and a memory chip package in which one memory chip is packaged can be used.

Figure 24A:
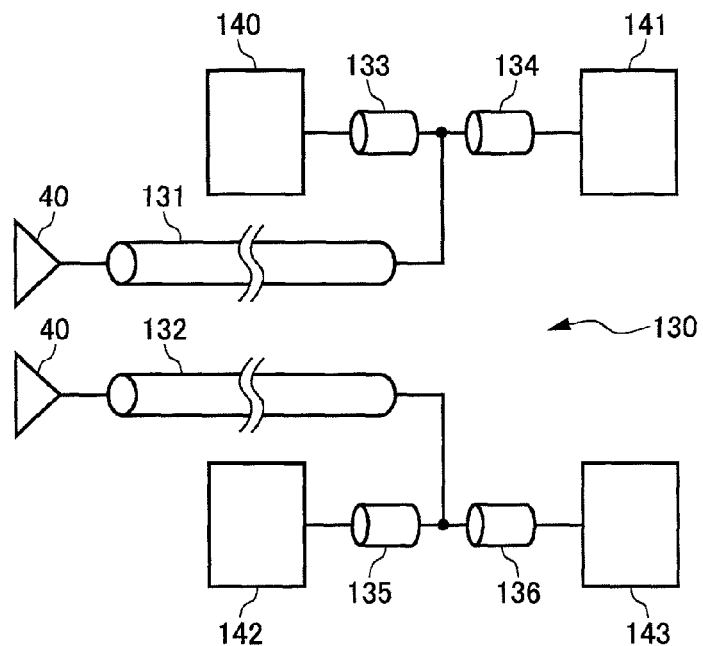
FIGS. 24A and 24B show another example that the present invention is applied to a four-rank product (R0 to R3), where
Figure 24B:
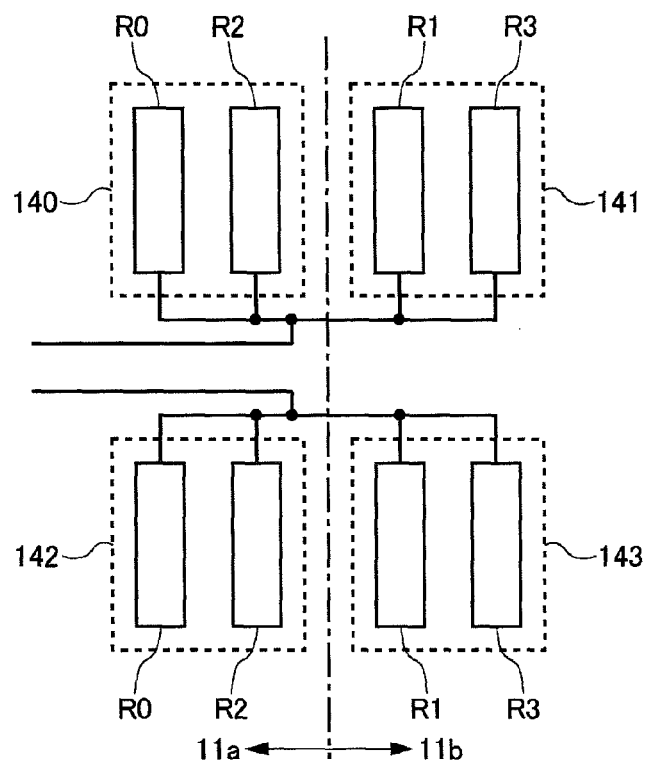

FIGS. 24A and 24B show another example that the present invention is applied to a four-rank product (R0 to R3), where FIG. 24A shows a structure of a data wiring 130, and FIG. 24B shows mounting positions of packages 140 to 143. In the example shown in FIGS. 24A and 24B, a data wiring of the packages 140 and 141 is commonly connected via a wiring portion 131, and a data wiring of the packages 142 and 143 is commonly connected via a wiring portion 132. The wiring portion 131 is branched to two wiring portions 133 and 134, and the wiring portions 133 and 134 are connected to the packages 140 and 141, respectively. Similarly, the wiring portion 132 is branched to two wiring portions 135 and 136, and the wiring portions 135 and 136 are connected to the packages 142 and 143, respectively. As shown in FIG. 24B, the packages 140 and 141 are oppositely arranged on the surface and the back surface of the module substrate 11. Similarly, the packages 142 and 143 are oppositely arranged on the surface and the back surface of the module substrate 11. Two memory chips included in the packages 140 and 142 are allocated to ranks R0 and R2, respectively, and two memory chips included in the packages 141 and 143 are allocated to ranks R1 and R3, respectively. As explained above, when a memory chip package in which two memory chips are packaged is used, the memory chip package can be used as a four-rank product.

Figure 25A:
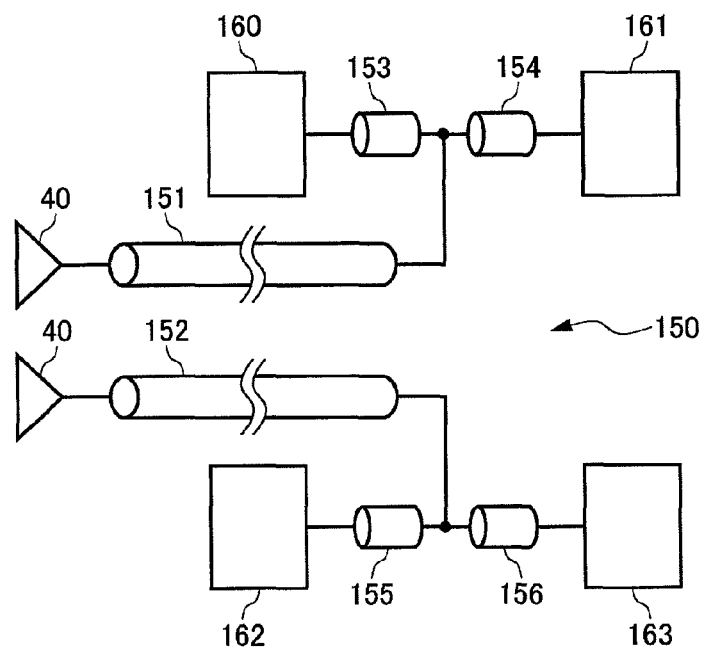
FIGS. 25A and 25B show an example where the present invention is applied to a two-rank product (R0, R1), where
Figure 25B:
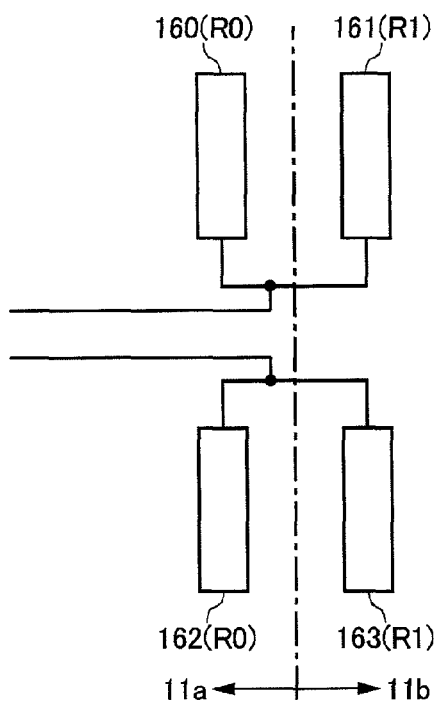

FIGS. 25A and 25B show an example where the present invention is applied to a two-rank product (R0, R1), where FIG. 25A shows a structure of a data wiring 150, and FIG. 25B shows mounting positions of packages 160 to 163. In the example shown in FIGS. 25A and 25B, one memory chip is packaged in one memory chip package. Wiring portions 151 to 156 that constitute the data wiring 150 are identical to the wiring portions 131 to 136 shown in FIGS. 24A and 24B. As shown in FIG. 25B, the packages 160 and 161 are oppositely arranged on the surface and the back surface of the module substrate 11. Similarly, the packages 162 and 163 are oppositely arranged on the surface and the back surface of the module substrate 11. As explained above, the present invention can be also applied to a two-rank product.

Figure 26A:
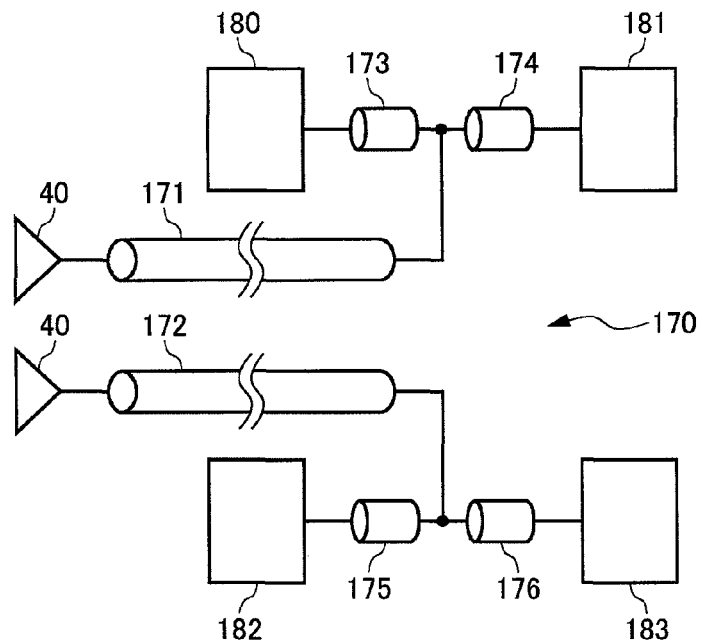
FIGS. 26A and 26B show another example where the present invention is applied to an eight-rank product (R0 to R7), where
Figure 26B:
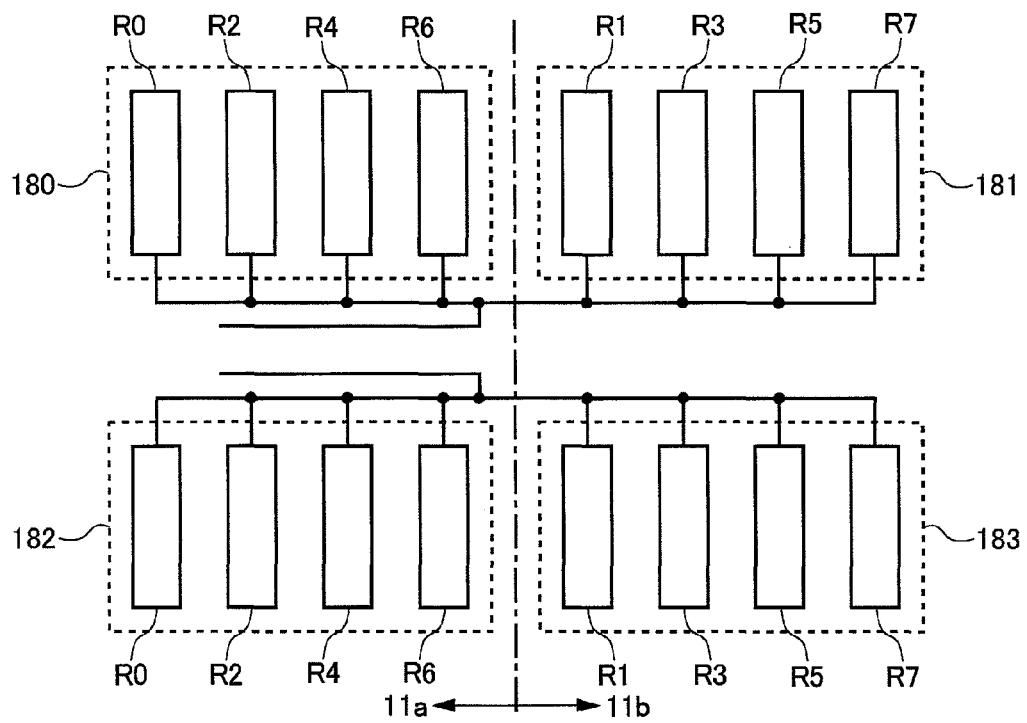

FIGS. 26A and 26B show another example where the present invention is applied to an eight-rank product (R0 to R7), where FIG. 26A shows a structure of a data wiring 170, and FIG. 26B shows mounting positions of packages 180 to 183. In the example shown in FIGS. 26A and 26B, four memory chips are packaged in one memory chip package. Wiring portions 171 to 176 that constitute the data wiring 170 are identical to the wiring portions 131 to 136 shown in FIGS. 24A and 24B. As shown in FIG. 26B, the packages 180 and 181 are oppositely arranged on the surface and the back surface of the module substrate 11. Similarly, the packages 182 and 183 are oppositely arranged on the surface and the back surface of the module substrate 11.

It is apparent that the present invention is not limited to the above embodiments, but may be modified and changed without departing from the scope and spirit of the invention.

What is claimed is:

1. A memory module comprising:
    a module substrate having a first surface and a second surface;
    a plurality of external terminals provided along a side of the module substrate extending to a first direction;
    a plurality of memory chips mounted on the module substrate; and
    a memory buffer mounted on the module substrate, the memory buffer at least buffering a data signal transferred between the memory chips and the external terminals, wherein
    the data signal includes a user data and an error correction code to correct an error of the user data,
    the memory chips include:
    a plurality of regular chips including at least first to fourth regular chips that store the user data; and
    a plurality of error-correction chips including first to fourth error-correction chips that store the error correction code,
    the module substrate has first and second mounting areas, coordinates of the first and second mounting areas in the first direction being different from each other,
    the second mounting area has third and fourth mounting areas, coordinates of the third and fourth mounting areas in a second direction that is different from the first direction being different from each other,
    the first and second regular chips are oppositely arranged on the first and second surfaces of the module substrate, respectively, in the first mounting area,
    the third and fourth regular chips are oppositely arranged on the first and second surfaces of the module substrate, respectively, in the first mounting area,
    the first and second error-correction chips are oppositely arranged on the first and second surfaces of the module substrate, respectively, in the third mounting area,
    the third and fourth error-correction chips are oppositely arranged on the first and second surfaces of the module substrate, respectively, in the third mounting area,
    the first error-correction chip and the third error-correction chip are adjacently arranged in the first direction,
    the second error-correction chip and the fourth error-correction chip are adjacently arranged in the first direction, and
    the memory buffer is arranged on the first surface of the module substrate in the fourth mounting area,
    the fourth mounting area being interposed between a boundary of the third mounting area and a portion of the side of the module substrate nearest to the boundary, so that the memory buffer is located nearer to the external terminals than the first to fourth error-correction chips.

2. The memory module as claimed in claim 1, wherein the first to fourth regular chips are exclusively selected, and the first to fourth error-correction chips are exclusively selected.

3. The memory module as claimed in claim 2, wherein
    the first regular chip and the first error-correction chip are selected simultaneously,
    the second regular chip and the second error-correction chip are selected simultaneously,
    the third regular chip and the third error-correction chip are selected simultaneously, and
    the fourth regular chip and the fourth error-correction chip are selected simultaneously.

4. The memory module as claimed in claim 1, wherein none of the regular chips including the first to fourth regular chips and the error-correction chips including the first to fourth error-correction chips are mounted on the second surface of the module substrate in the fourth mounting area.

5. The memory module as claimed in claim 1, wherein
the first regular chip and the third regular chip are adjacently arranged in the second direction, and
the second regular chip and the fourth regular chip are adjacently arranged in the second direction.

6. The memory module as claimed in claim 1, further comprising a data wiring formed on the module substrate that transfers the error correction code between the memory buffer and the first to fourth error-correction chips, wherein the data wiring includes:
- a first wiring portion commonly allocated to the first to fourth error-correction chips;
- second and third wiring portions branched from the first wiring portion, the second wiring portion commonly allocated to the first and second error-correction chips, and the third wiring portion commonly allocated to the third and fourth error-correction chips;
- fourth and fifth wiring portions branched from the second wiring portion, the fourth wiring portion allocated to the first error-correction chip, and the fifth wiring portion allocated to the second error-correction chip; and
- sixth and seventh wiring portions branched from the third wiring portion, the sixth wiring portion allocated to the third error-correction chip, and the seventh wiring portion allocated to the fourth error-correction chip, and
- a branch point of the fourth and fifth wiring portions and a branch point of the sixth and seventh wiring portions are positioned in a through-hole electrode provided in the module substrate.

7. The memory module as claimed in claim 1, wherein
the memory buffer supplies a first termination control signal to any one of the first to fourth regular chips and to any one of the first to fourth error-correction chips, and
the memory buffer supplies a second termination control signal to any one of the other ones of the first to fourth regular chips and to any one of the other ones of the first to fourth error-correction chips.

* * * * *